United States Patent
Lee et al.

(10) Patent No.: US 9,698,151 B2
(45) Date of Patent: Jul. 4, 2017

(54) VERTICAL MEMORY DEVICES

(71) Applicants: Seung-Min Lee, Suwon-si (KR);
Hoo-Sung Cho, Yongin-si (KR);
Jeong-Seok Nam, Osan-si (KR);
Jong-Min Lee, Ulsan (KR); Yong-Joon Choi, Suwon-si (KR)

(72) Inventors: Seung-Min Lee, Suwon-si (KR);
Hoo-Sung Cho, Yongin-si (KR);
Jeong-Seok Nam, Osan-si (KR);
Jong-Min Lee, Ulsan (KR); Yong-Joon Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/179,068

(22) Filed: Jun. 10, 2016

(65) Prior Publication Data
US 2017/0103993 A1    Apr. 13, 2017

Related U.S. Application Data

(60) Provisional application No. 62/238,918, filed on Oct. 8, 2015.

(30) Foreign Application Priority Data

Nov. 26, 2015  (KR) .......................... 10-2015-0166489

(51) Int. Cl.
*H01L 27/115*   (2017.01)
*H01L 27/11565* (2017.01)
(Continued)

(52) U.S. Cl.
CPC .. *H01L 27/11565* (2013.01); *H01L 21/76816* (2013.01); *H01L 21/76877* (2013.01);
(Continued)

(58) Field of Classification Search
CPC ......... H01L 27/11565; H01L 27/11582; H01L 27/1157; H01L 21/76877; H01L 23/5226; H01L 23/528; H01L 21/7686
See application file for complete search history.

(56) References Cited

U.S. PATENT DOCUMENTS 6,734,971 B2 * 5/2004 Smith ................. G03F 7/70558
                                                     356/401
7,547,979 B2   6/2009 Jung et al.
(Continued)

FOREIGN PATENT DOCUMENTS

JP   2005051230 A   2/2005
KR   100546354 B1   1/2006
(Continued)

*Primary Examiner* — William Coleman
(74) *Attorney, Agent, or Firm* — Harness, Dickey & Pierce, P.L.C.

(57) ABSTRACT

A vertical memory device includes a substrate, a plurality of channels on the substrate and extending in a first direction that is vertical to a top surface of the substrate, a plurality of gate lines stacked on top of each other on the substrate, a plurality of wiring over the gate lines and electrically connected to the gate lines, and an identification pattern on the substrate at the same level as a level of at least one of the wirings. The gate lines surround the channels. The gate lines are spaced apart from each other along the first direction.

20 Claims, 42 Drawing Sheets

(51) Int. Cl.
  *H01L 27/1157* (2017.01)
  *H01L 27/11582* (2017.01)
  *H01L 23/528* (2006.01)
  *H01L 23/522* (2006.01)
  *H01L 21/768* (2006.01)

(52) U.S. Cl.
  CPC ........ *H01L 23/528* (2013.01); *H01L 23/5226* (2013.01); *H01L 27/1157* (2013.01); *H01L 27/11582* (2013.01)

(56) References Cited

U.S. PATENT DOCUMENTS

| | | | |
|---|---|---|---|
| 7,679,133 B2 | 3/2010 | Son et al. | |
| 8,553,466 B2 | 10/2013 | Han et al. | |
| 8,559,235 B2 | 10/2013 | Yoon et al. | |
| 8,581,424 B2* | 11/2013 | Hirai | G11C 13/0007 257/211 |
| 8,654,587 B2 | 2/2014 | Yoon et al. | |
| 8,946,023 B2 | 2/2015 | Makala et al. | |
| 8,956,968 B2 | 2/2015 | Higashitani et al. | |
| 2005/0023648 A1 | 2/2005 | Jung et al. | |
| 2011/0065270 A1 | 3/2011 | Shim et al. | |
| 2011/0233648 A1 | 9/2011 | Seol et al. | |
| 2013/0020707 A1 | 1/2013 | Or-Bach et al. | |
| 2014/0273373 A1* | 9/2014 | Makala | H01L 27/11582 438/270 |
| 2015/0054046 A1 | 2/2015 | Higashitani et al. | |
| 2015/0303214 A1* | 10/2015 | Kim | H01L 27/11582 257/329 |
| 2016/0027796 A1* | 1/2016 | Yang | H01L 27/11573 257/314 |
| 2016/0126107 A1* | 5/2016 | Kil | H01L 21/31111 438/268 |

FOREIGN PATENT DOCUMENTS

| | | |
|---|---|---|
| KR | 100591763 B1 | 6/2006 |
| KR | 20110029403 A | 3/2011 |

* cited by examiner

286a

286b

FIG. 15
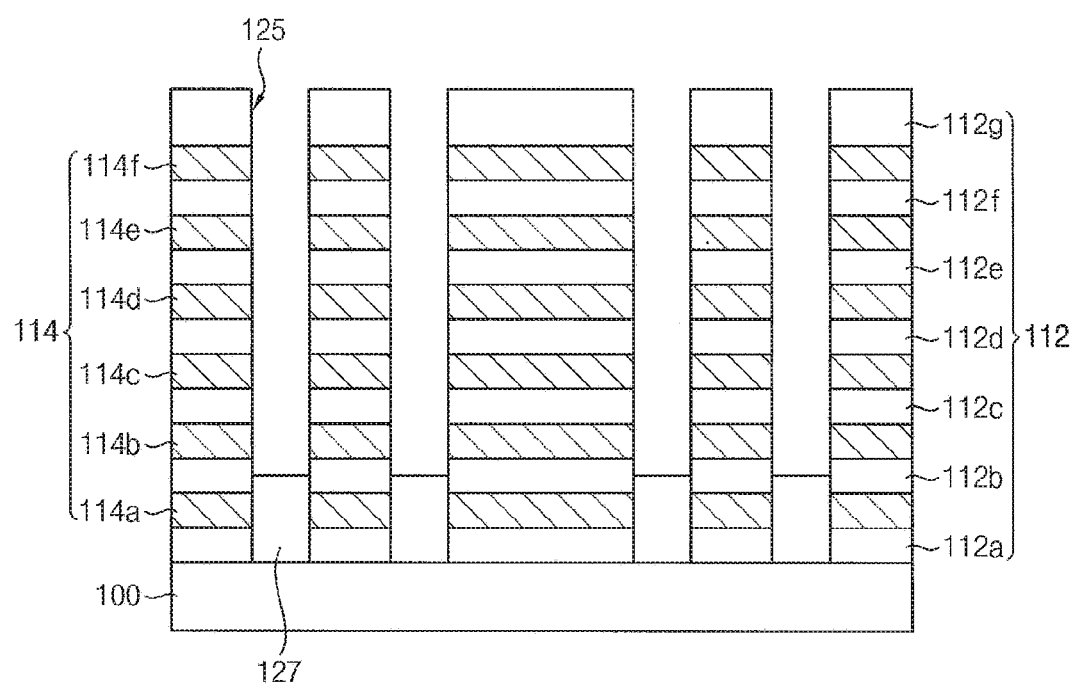
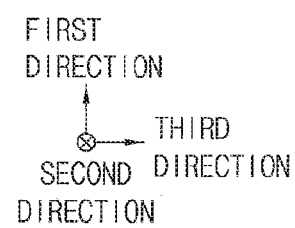

FIG. 17
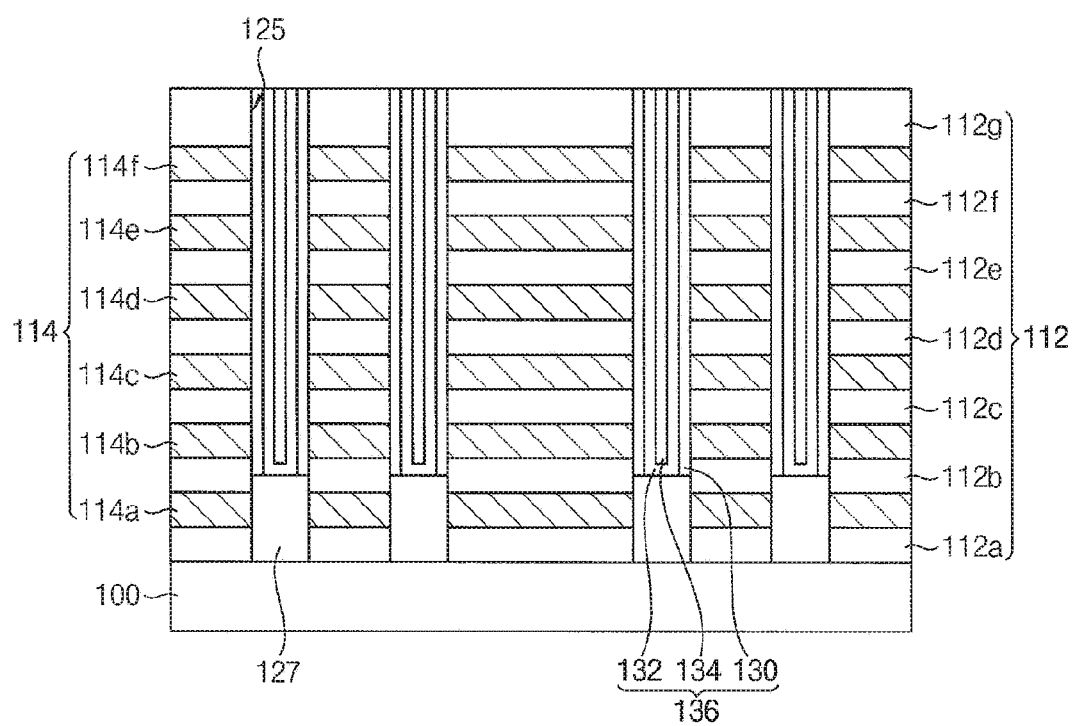
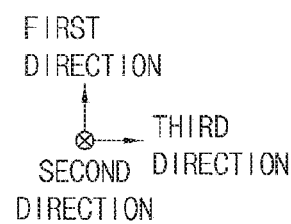

FIG. 21
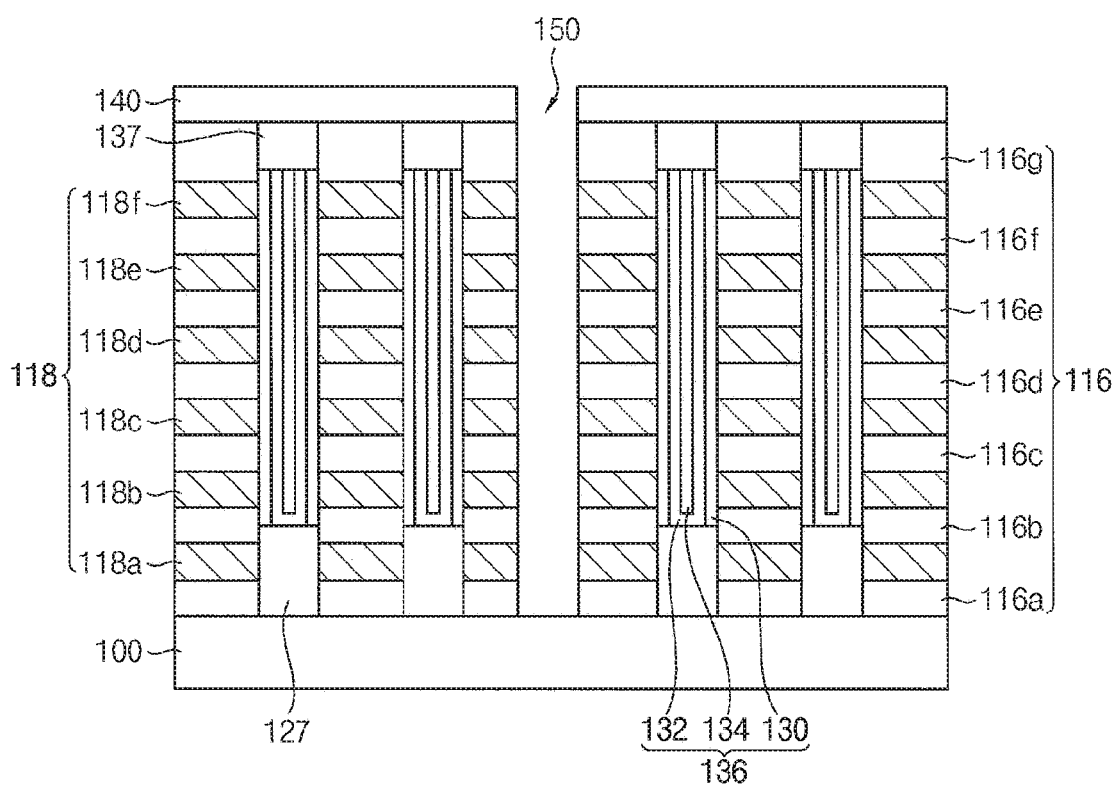
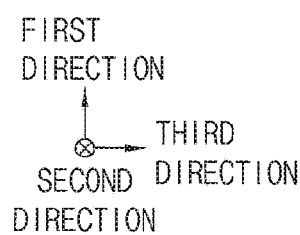

FIG. 28
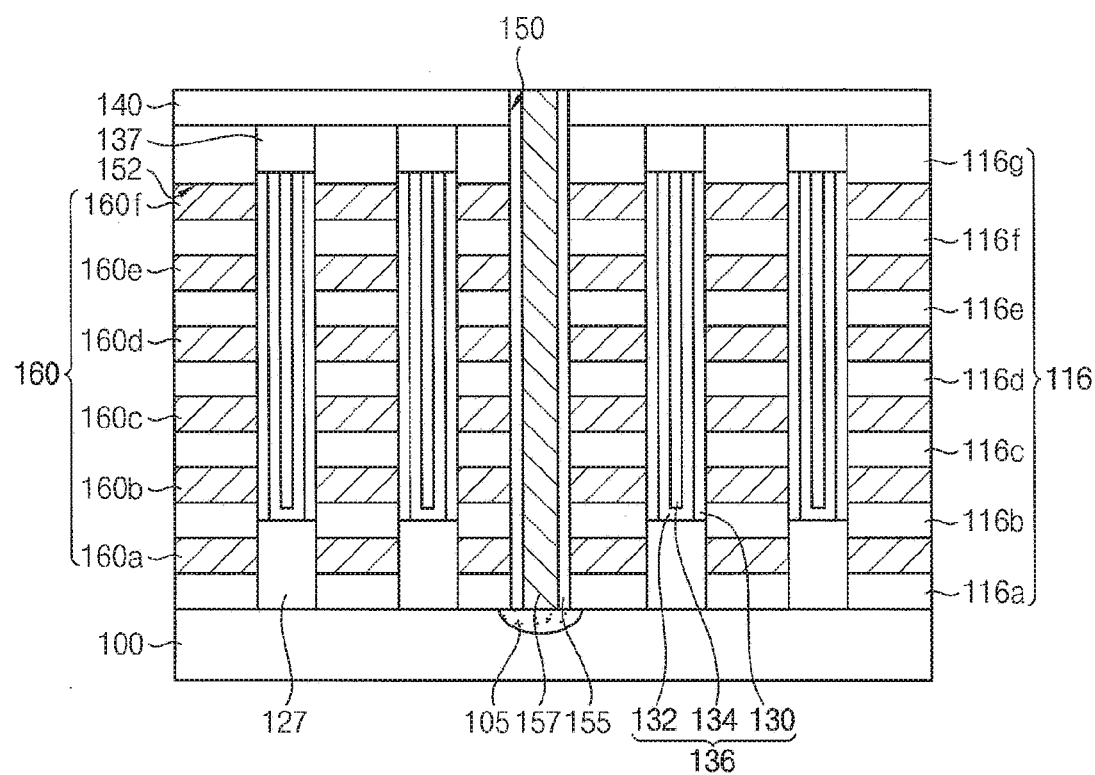
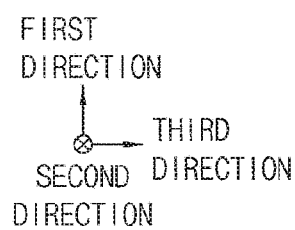

FIG. 35
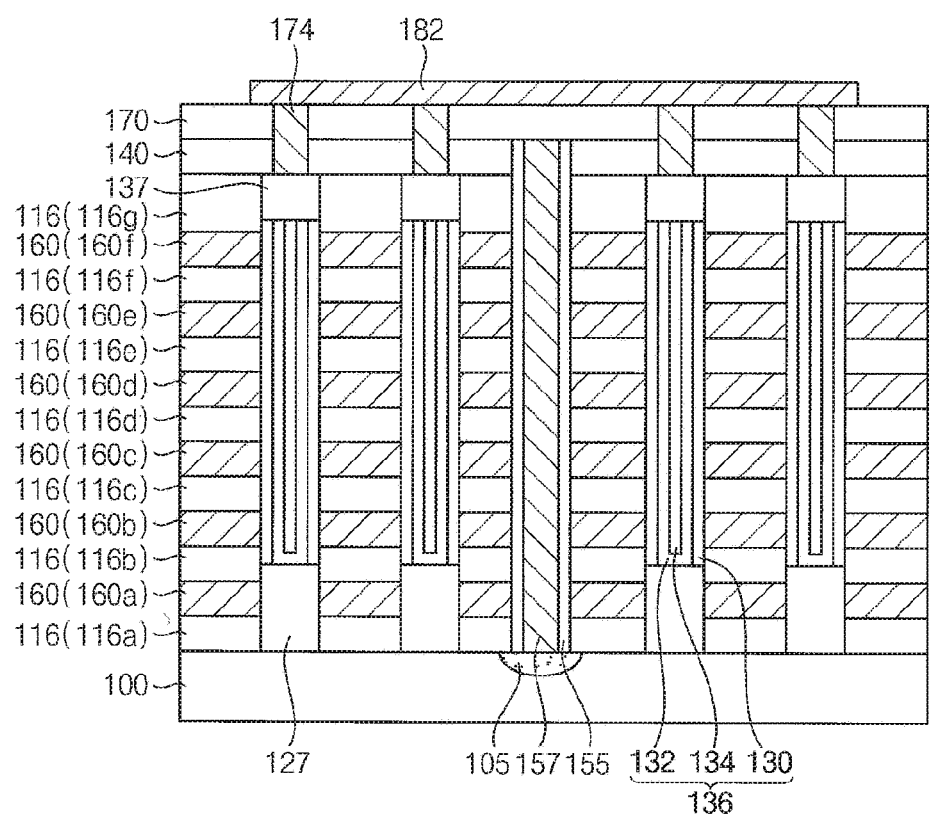
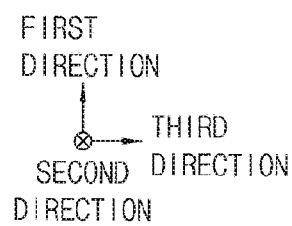

VERTICAL MEMORY DEVICES

CROSS-REFERENCE TO RELATED APPLICATION

This U.S. Non-Provisional application claims priority under 35 USC §119 to U.S. Provisional Application No. 62/238,918 filed on Oct. 8, 2015 in the USPTO, and Korean Patent Application No. 10-2015-0166489 filed on Nov. 26, 2015 in the Korean Intellectual Property Office (KIPO). The entire contents of the above-referenced applications are incorporated by reference herein.

BACKGROUND

1. Field

Example embodiments relate to vertical memory devices and methods of manufacturing the same. More particularly, example embodiments relate to vertical memory devices including vertically stacked gate lines and methods of manufacturing the same.

2. Description of Related Art

Recently, a vertical memory device including a plurality of memory cells stacked vertically with respect to a surface of a substrate has been developed for achieving a high degree of integration. In the vertical memory device, a channel having a pillar shape or a cylindrical shape may protrude vertically from the surface of the substrate, and gate lines surrounding the channel may be repeatedly stacked.

As the degree of integration of the vertical memory device becomes greater, the number of the gate lines, and the number of blocks including the channel and the gate lines may increase. Thus, a complexity of the vertical memory device may be intensified.

SUMMARY

Example embodiments provide a vertical memory device having improved process and operation reliability.

Example embodiments provide a method of manufacturing a vertical memory device having improved process and operation reliability.

According to example embodiments, a vertical memory device includes a substrate; a plurality of channels on the substrate, the channels extending in a first direction that is vertical to a top surface of the substrate; a plurality of gate lines stacked on top of each other on the substrate, the gate lines surrounding the channels, the gate lines spaced apart from each other along the first direction; a plurality of wirings over the gate lines and electrically connected to the gate lines; and an identification pattern on the substrate at the same level as a level of at least one of the wirings.

In example embodiments, the gate lines at each level may include a step portion extending in a second direction parallel to the top surface of the substrate, and the wirings may be electrically connected to the step portions of corresponding gate lines.

In example embodiments, the identification pattern may be spaced apart from the channels in the second direction with respect to the wirings.

In example embodiments, the vertical memory device may further include a dummy wiring on the substrate between the identification pattern and one of the wirings.

In example embodiments, the vertical memory device may further include a bit line extending in a third direction that may be parallel to the top surface of the substrate and crosses the second direction. The bit line may be connected to at least one of the channels. The identification pattern and the bit line may be at the same level.

In example embodiments, the identification pattern may be between the bit line and the wirings in a plan view.

In example embodiments, the wirings may be disposed at a plurality of levels over the substrate, and the identification pattern may be at the same level as a level of a lowermost wiring of the wirings.

In example embodiments, the wirings may be disposed at a plurality of levels over the substrate, and the identification pattern may be disposed at the same level as that of an uppermost wiring of the wirings.

In example embodiments, the wirings may be disposed at a plurality of levels over the substrate, and the identification pattern may be disposed at two or more levels of the plurality of the levels.

In example embodiments, the identification pattern may include one of a plurality of dot patterns, a plurality of line patterns, or a combination of a dot pattern and a line pattern.

In example embodiments, the identification pattern may include the plurality of the line patterns, and the line patterns may cross each other.

In example embodiments, the identification pattern and the wiring may include a conductive material that is the same.

According to example embodiments, a vertical memory device includes a substrate; a plurality of cell blocks on the substrate; a plurality of wirings; and an identification pattern on the substrate. Each of the cell blocks includes: a plurality of channels extending in a first direction vertical to a top surface of the substrate, and a plurality of gate lines stacked on top of each other on the substrate. The gate lines surround the channels. The gate lines are spaced apart from each other along the first direction. The plurality of wirings are over the gate lines and electrically connected to the gate lines. The identification pattern corresponds to at least one of the plurality of the cell blocks.

In example embodiments, the identification pattern may be disposed at the same level as a level of at least one of the wirings.

In example embodiments, the gate lines may extend in a second direction parallel to the top surface of the substrate. The plurality of the cell blocks may be spaced apart from each other along a third direction that may be parallel to the top surface of the substrate. The third direction may cross the second direction.

In example embodiments, the vertical memory device may further include a cutting pattern on the substrate between the cell blocks.

In example embodiments, the substrate may include a cell region and an extension region. The channels may be on the cell region. The end portions of the gate lines may be on the extension region. The cutting pattern may extend over the cell region and the extension region.

In example embodiments, the cutting pattern may be a common source line.

In example embodiments, the vertical memory device may further include a plurality of block groups on the substrate and arranged in the third direction. Each of the block groups may include a group of the cell blocks.

In example embodiments, the identification pattern may be provided per each block group.

In example embodiments, at least one of the cell blocks may further include dummy wirings adjacent to the wirings.

In example embodiments, a dummy wiring included in a cell block of the cell blocks in which the identification pattern may be provided may have a different shape from those of remaining dummy wirings of the dummy wirings.

According to example embodiments, a vertical memory device includes a substrate including a cell region, an extension region and a peripheral region; a plurality of vertical channels on the cell region; gate lines on the substrate, the gate lines surrounding the vertical channels, the gate lines stacked on top of each other on a top surface of the substrate, the gate lines extending over the cell region and the extension region; contacts electrically connected to the gate lines on the extension region; wirings electrically connected to the gate lines via the contacts, the wirings extending from the extension region to the peripheral region; and an identification pattern on the substrate over an uppermost gate line of the gate lines.

In example embodiments, the identification pattern may be at the same level as that of at least one of the wirings.

In example embodiments, the vertical channels may extend in a first direction that may be vertical to a top surface of the substrate, and the gate lines may extend in a second direction and a third direction that may be parallel to the top surface of the substrate and may cross each other.

In example embodiments, the extension region may include a first extension region and a second extension region. The first extension region may be adjacent to both lateral portions of the cell region in the second direction. The second extension region may be adjacent to both lateral portions of the cell region in the third direction. The peripheral region may include a first peripheral region and a second peripheral region. The first peripheral region may be adjacent to a lateral portion of the first extension region in the second direction. The second peripheral region may be adjacent to a lateral portion of the second extension region in the third direction.

In example embodiments, the contacts and the wirings may be arranged on the first extension region, and the second extension region may serve as a dummy region. The first peripheral region may be a decoder region, and the second peripheral region may be a page buffer region.

In example embodiments, the vertical memory device may include a plurality of identification patterns on the substrate. The identification patterns may include the identification pattern. The identification patterns may be on at least two of the cell region, the first extension region, the second extension region, the first peripheral region, and the second peripheral region.

In example embodiments, the gate lines may include a ground selection line (GSL), word lines and a string selection line (SSL) sequentially stacked from the top surface of the substrate. The first extension region may include a first contact region and a second contact region facing each other with respect to the cell region.

In example embodiments, the wirings may include a first wiring electrically connected to the GSL and the word lines on the first contact region, and a second wiring electrically connected to the SSL on the second contact region.

In example embodiments, the identification pattern may include a first identification pattern adjacent to the first wiring, and a second identification pattern adjacent to the second wiring.

According to example embodiments, a method of manufacturing a vertical memory device includes forming a mold structure on a substrate, the forming a mold structure including forming insulating interlayers and sacrificial layers alternately and repeatedly on the substrate; forming channels that extend through the mold structure on the substrate; forming an opening that linearly extends through the mold structure; removing the sacrificial layers through the opening; forming gate lines in spaces from which the sacrificial layers are removed; forming first wirings electrically connected to the gate lines; forming an identification pattern on the substrate at the same level as a level of the first wirings; detecting a failure by applying an electrical signal through the first wirings; and forming a second wiring over the first wirings, the second wiring being electrically connected to at least one of the first wirings.

In example embodiments, the detecting the failure may include using the identification pattern as one of an address identification guide and a reference pattern.

In example embodiments, the method may include forming a plurality of cell blocks on the substrate. The cell blocks may be defined by the channels, the gate lines and the first wirings. The detecting the failure may include using the identification pattern as the address identification guide or the reference pattern for selecting a desired cell block from the plurality of the cell blocks.

In example embodiments, the first wirings and the identification pattern may be formed by the same patterning process.

According to example embodiments, a vertical memory device includes a substrate including a cell region, extension region, and a peripheral region; a cell block including gate lines stacked on top of each other, and channels extending vertically through the gate lines; an insulation layer on the cell block, the insulation layer extending over the cell region, the extension region, and the peripheral region; and a conductive pattern on the insulation layer. The conductive pattern includes wirings and an identification pattern that are spaced apart each other on the insulation layer. The wirings are electrically connected to the gate lines, and the identification pattern is at the same level above the substrate as a level of the wirings.

In example embodiments, the conductive pattern may include bit lines at the same level above the substrate as the wirings and the identification pattern, the bit lines may be electrically connected to the channels, and the bit lines may be spaced apart from the wirings and the identification pattern.

In example embodiments, the conductive pattern may include a dummy pattern, the dummy pattern may be spaced apart from the wirings and the identification pattern at the same level, and the identification pattern may be over the peripheral region.

In example embodiments, the vertical memory device may further include bit lines on the cell block and a second insulation layer on top of the bit lines and the insulation layer. The insulation layer may be a first insulation layer, and the conductive pattern may be on top of the second insulation layer.

In example embodiments, the wirings and the identification pattern may be formed of the same material.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIGS. 10 to 35 are cross-sectional views and top plan views illustrating a method of manufacturing a vertical memory device in accordance with example embodiments;

DESCRIPTION OF EXAMPLE EMBODIMENTS

Figure 1:
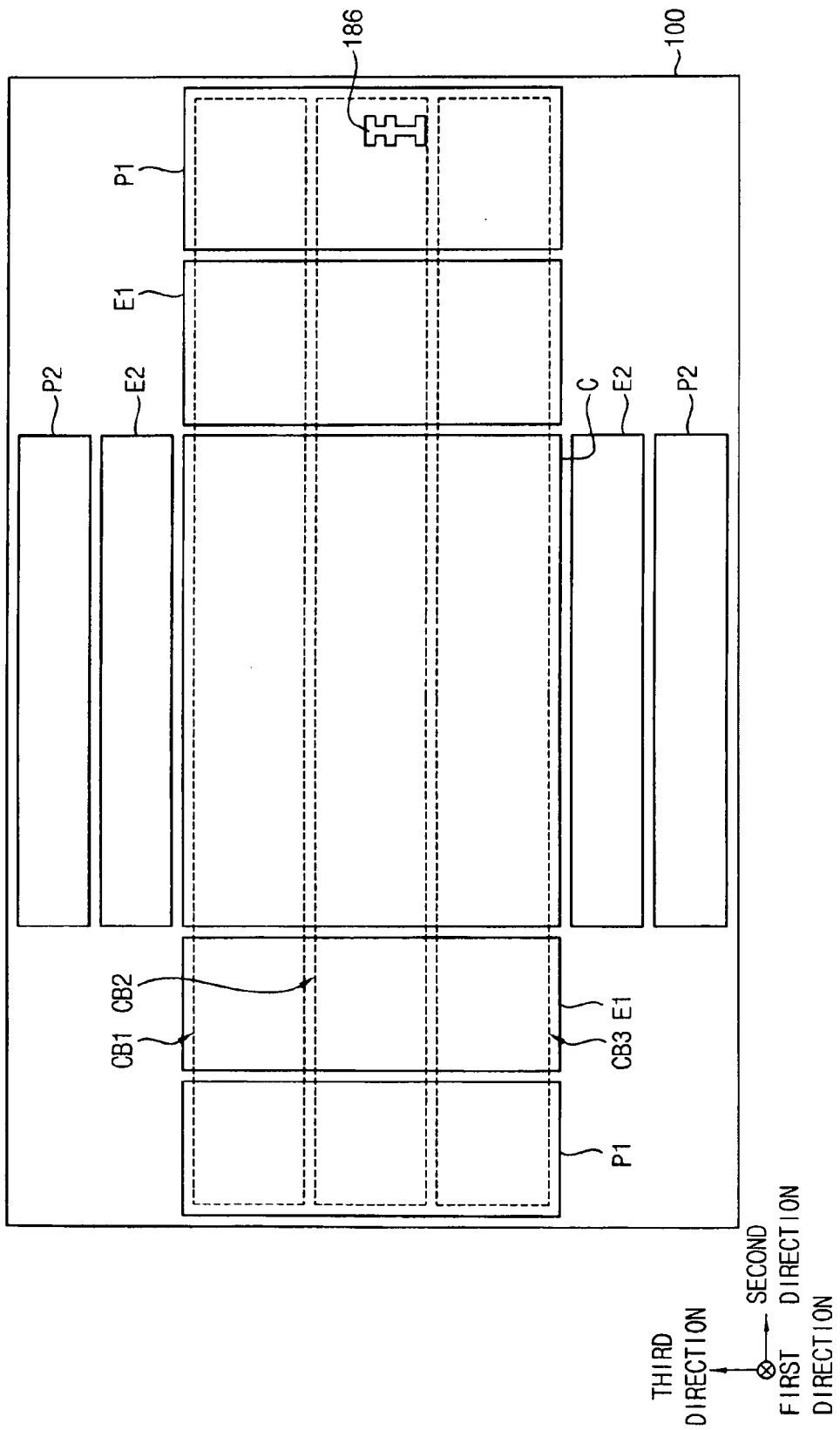
FIG. 1 is a schematic top plan view illustrating regions of a vertical memory device in accordance with example embodiments.

Various example embodiments will be described more fully hereinafter with reference to the accompanying drawings, in which example embodiments are shown. Inventive concept mays, however, be embodied in many different forms and should not be construed as limited to the example embodiments set forth herein. Rather, these example embodiments are provided so that this description will be thorough and complete, and will fully convey the scope of inventive concepts to those skilled in the art. In the drawings, the sizes and relative sizes of layers and regions may be exaggerated for clarity. Like reference characters and/or numerals in the drawings denote like elements, and thus their description may not be repeated.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of inventive concepts.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

A direction substantially vertical to a top surface of a substrate is referred to as a first direction, and two directions substantially parallel to the top surface of the substrate and crossing each other are referred to as a second direction and a third direction. For example, the second direction and the third direction are substantially perpendicular to each other. Additionally, a direction indicated by an arrow and a reverse direction thereof are considered as the same direction. The above mentioned definitions of the directions are the same throughout all the figures in this specification.

Figure 2:
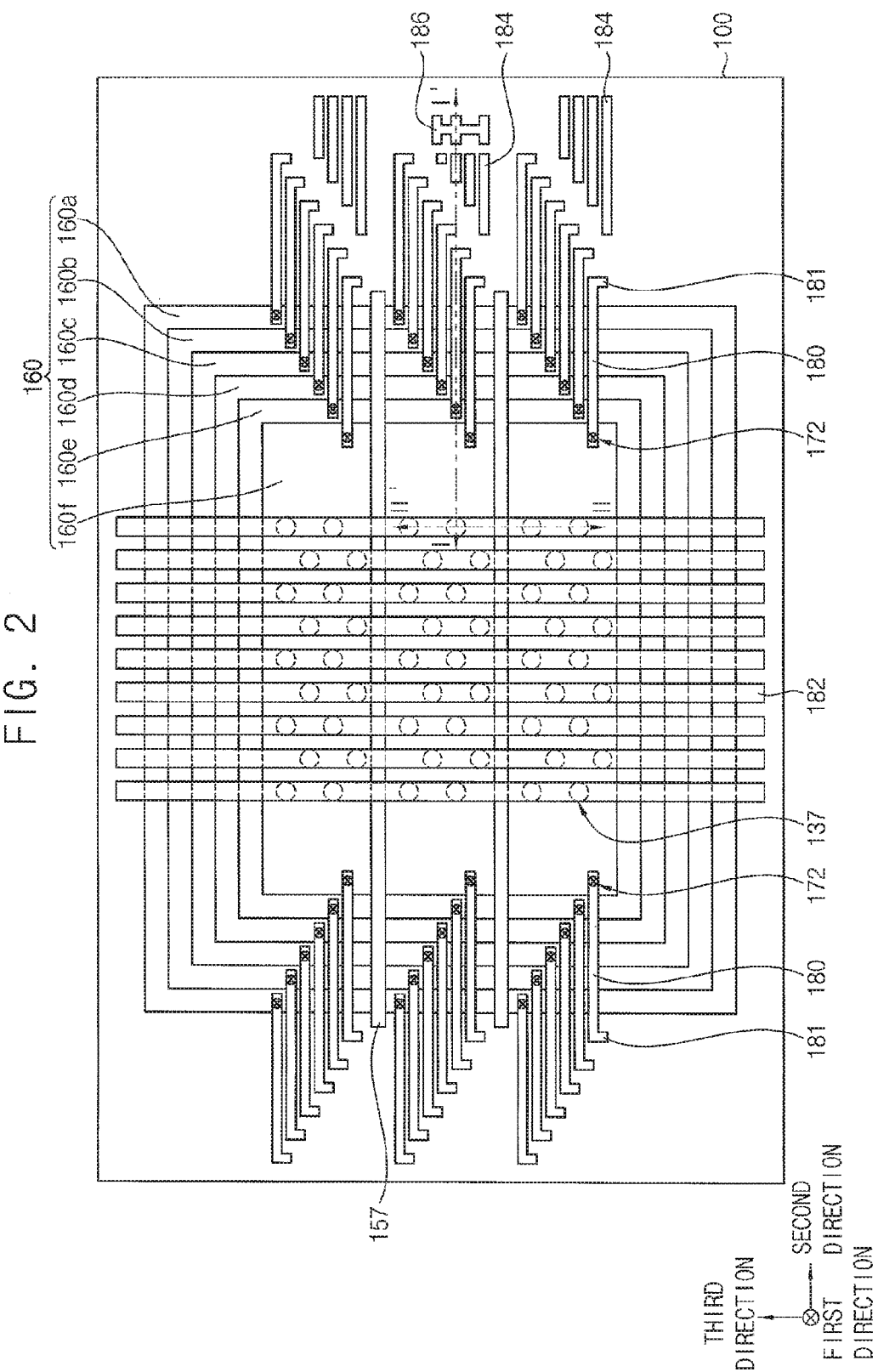
FIGS. 2 to 4 are a top plan view and cross-sectional views illustrating a vertical memory device in accordance with example embodiments.
Figure 3:
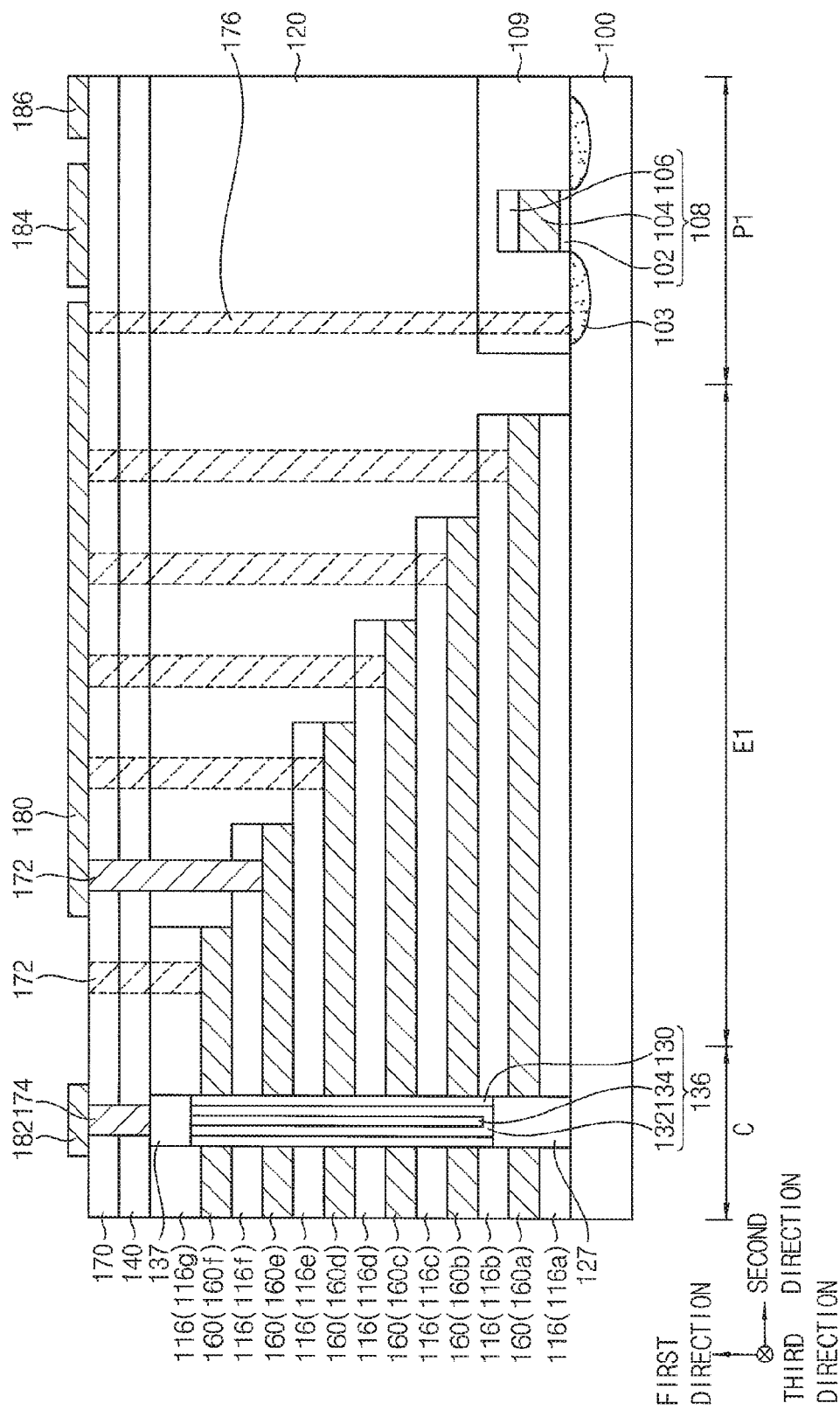
Figure 4:
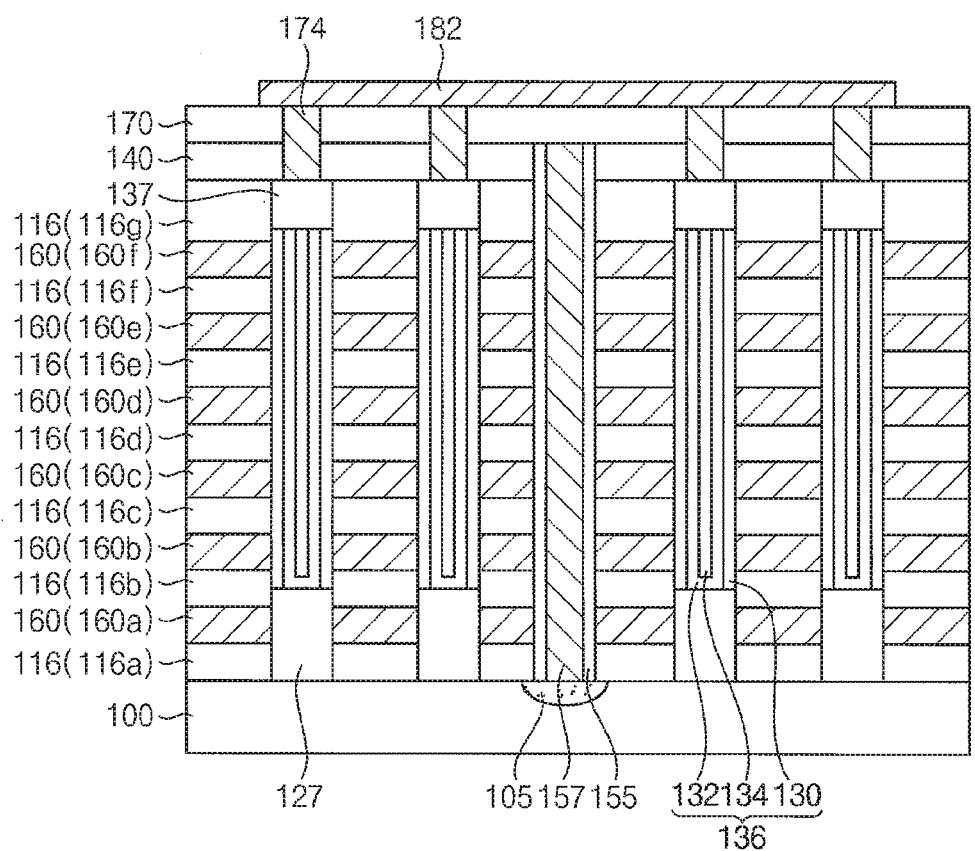

FIG. 1 is a schematic top plan view illustrating regions of a vertical memory device in accordance with example embodiments. FIGS. 2 to 4 are a top plan view and cross-sectional views illustrating a vertical memory device in accordance with example embodiments. For convenience of descriptions, an illustration of some insulating structures is omitted in FIG. 2.

Referring to FIGS. 1 and 2, the vertical memory device may include a substrate 100 including a cell region C, extension regions E1 and E2, and peripheral regions P1 and P2.

As illustrated in FIG. 2, pads 137 disposed on vertical channel structures 136 (see FIGS. 3 and 4) may be arranged on the cell region C, and a plurality of gate lines 160 (e.g., 160a through 160f) may surround the vertical channel structures 136 and may be stacked along the first direction.

The extension regions may include a first extension region E1 and a second extension region E2. For example, a pair of the first extension regions E1 may be located at both lateral portions of the cell region C in the second direction. A first peripheral region P1 may be adjacent to the first extension region E1 at a peripheral portion of the substrate 100 in the second direction.

In example embodiments, step portions of the gate lines 160 may be arranged on the first extension region E1. A first wiring 180 may be electrically connected to each step portion via a first contact 172. The step portion of the gate line 160 on the first extension region E1 may serve as a contact pad.

For example, the first wiring 180 may extend in the second direction from the first extension region E1 to the first peripheral region P1.

A wiring pad 181 may be formed at an end portion of the first wiring 180 on the first peripheral region P1. For example, the first wiring 180 may be electrically connected to a peripheral circuit contact 176 (see FIG. 3) via the wiring pad 181.

Dummy wirings 184 may be further arranged on the first peripheral circuit region P1 to be adjacent to the first wirings 180. In example embodiments, the dummy wirings 184 may be at the same level as that of the first wirings 180, and may be utilized as a mark for identifying the first peripheral region P1.

A pair of the second extension regions E2 may be located at both lateral portions of the cell region C in the third direction. The step portions of the gate lines 160 may be also arranged on the second extension region E2. In example embodiments, the first wirings 180 and/or the first contacts 172 may not be arranged on the second extension region E2, and the second extension region E2 may be allotted as a dummy region.

A second peripheral region P2 may be adjacent to the second extension region E2 at a peripheral portion of the substrate 100 in the third direction.

A cutting pattern 157 may be disposed on the cell region C and the first extension region E1, and may extend through the gate lines 160.

In example embodiments, the cutting pattern 157 may extend in the second region throughout the cell region C and the first extension region E1, and may intersect or cut the gate lines 160 along the first direction. A plurality of the cutting patterns 157 may be arranged along the third direction on the cell region C.

A plurality of cell blocks may be defined by the cutting pattern 157. As illustrated in FIG. 1, first to third cell blocks CB1, CB2 and CB3 may be defined by two cutting patterns 157. The number of the cutting patterns 157, and the number of the cell blocks may be greater depending on a capacity and a degree of integration of the vertical memory device.

Each cell block may include the gate lines 160 that may be cut by the cutting pattern 157 and stacked along the first direction, the vertical channel structures 136 extending through the gate lines 160, and the first wirings 180 electrically connected to the step portions of the gate lines 160. In example embodiments, the cell block may further include the dummy wirings 184.

The first peripheral region P1 may serve as a decoder region for selecting the cell block or applying a signal to the first wirings 180.

In example embodiments, an identification pattern 186 may be included in at least one of the cell blocks. In example embodiments, the identification pattern 186 may be at the same level as that of the first wirings 180, and may be disposed on the first peripheral region P1.

In example embodiments, the identification pattern 186 may be adjacent to the dummy wiring 184. For example, as illustrated in FIG. 1, the identification pattern 186 may be included in the second cell block CB2 (or next to the second cell block CB2 in the second direction). In this case, the dummy wiring 184 included in the second cell block CB2 may have a different shape from those of the dummy wirings 184 in the first and third cell blocks CB1 and CB3.

For example, the dummy wiring 184 included in the second cell block CB2 may be shorter than those included in the first and third cell blocks CB1 and CB3.

The identification pattern 186 may be utilized as an address identification guide for, e.g., applying a signal and/or selecting the cell block on the first peripheral region P1. A desired cell block may not be easily determined when searching an address or performing various detections because the cell blocks may have a structure substantially the same as or similar to each other and may include repeated patterns. However, the identification pattern 186 may be included at least one of the cell blocks, and a reference pattern may be provided for the address identification.

Further, the dummy wirings 184 may be also utilized as the reference pattern for identifying addresses and/or the regions of the vertical memory device.

For example, as illustrated in FIGS. 1 and 2, the identification pattern 186 may include a combination of line patterns that may extend in different directions. However, a shape of the identification pattern 186 may be modified in consideration of the convenience of identification or a patterning process.

A bit line 182 may extend in, e.g., the third direction and may be electrically connected to the vertical channel structures 136 via the pads 137. A plurality of the bit lines 182 may be arranged along the second direction on the cell region C.

In example embodiments, the bit line 182 may extend throughout the cell region C and the pair of the second extension regions E2 adjacent to the cell region C. In example embodiments, the bit line 182 may extend to the second peripheral region P2. The second peripheral region P2 may serve as a page buffer region.

Hereinafter, elements and constructions of the vertical memory device will be described in more detail with reference to FIGS. 3 and 4. FIGS. 3 and 4 are cross-sectional views taken along lines I-I' and II-II' of FIG. 2, respectively.

The substrate 100 may include a semiconductor material, e.g., silicon and/or germanium. In example embodiments, the substrate 100 may include single crystalline silicon. For example, the substrate 100 may serve as a body and/or a p-type well of the vertical memory device.

The vertical channel structure 136 may extend through the gate lines 160 and insulating interlayer patterns 116 (e.g., 116a through 116g) in the first direction on the cell region C. The vertical channel structure 136 may include a channel 132, a dielectric layer structure 130 and a filling insulation pattern 134. In example embodiments, a semiconductor pattern 127 may be interposed between the substrate 100 and the vertical channel structure 136.

The channel 132 may have a hollow cylindrical shape or a cup shape. The channel 132 may include polysilicon or single crystalline silicon, and may include p-type impurities such as boron (B) in a portion thereof.

The filling insulation pattern 134 may fill an inner space of the channel 132, and may have a solid cylindrical shape or a pillar shape. The filling insulation pattern 134 may include an insulation material such as silicon oxide. In example embodiments, the channel 132 may have a pillar shape or a solid cylindrical shape, and the filling insulation pattern 134 may be omitted.

The dielectric layer structure 130 may be formed on an outer sidewall of the channel 132. The dielectric layer structure 130 may have a straw shape or a cylindrical shell shape.

The dielectric layer structure 130 may include a tunnel insulation layer, a charge storage layer and a blocking layer which may be sequentially stacked from the outer sidewall of the channel 132. The blocking layer may include silicon oxide or a metal oxide such as hafnium oxide or aluminum oxide. The charge storage layer may include a nitride such as silicon nitride or a metal oxide, and the tunnel insulation layer may include an oxide such as silicon oxide. For example, the dielectric layer structure 130 may have an oxide-nitride-oxide (ONO) layered structure.

The semiconductor pattern 127 may include single crystalline silicon or polysilicon. The semiconductor pattern 127 may be in contact with bottoms of the dielectric layer structure 130 and the channel 132.

The pad 137 may be formed on the vertical channel structure 136. For example, the pad 137 may be electrically connected to, e.g., the bit line 182, and may serve as a source/drain region through which charges may be moved or transferred to the channel 132. The pad 137 may include polysilicon or single crystalline silicon, and may be optionally doped with n-type impurities such as phosphorus (P) or arsenic (As).

As illustrated in FIG. 2, a plurality of the pads 137 may be arranged along the second direction on the cell region C such that a pad row may be defined, and a plurality of the pad rows may be arranged in the third direction. The vertical channel structures 136 may be also arranged according to an arrangement of the pads 137. For example, a plurality of the vertical channel structures 136 may be arranged along the second direction on the cell region C to form a channel row, and a plurality of the channel rows may be arranged in the third direction.

The gate lines 160 may be formed on an outer sidewall of the dielectric layer structure 130 or the semiconductor pattern 127, and may be spaced apart from each other along the first direction. In example embodiments, each gate line 160 may partially surround the channels 132 or the vertical channel structures 136 included in at least one of the channel rows and may extend in the second direction.

In example embodiments, each gate line 160 may surround the number of the channel rows, e.g., 4 channel rows. In this case, a gate line stack structure may be defined by the 4 channel rows and the gate lines 160 surrounding the 4 channel rows. A plurality of the gate line stack structures may be arranged along the third direction.

In example embodiments, widths or length of the gate lines 160 in the second direction may be reduced along the first direction from the top surface of the substrate 100. For example, as illustrated in FIG. 3, a plurality of the gate lines 160 may be stacked in a pyramidal shape or a stepped shape.

Accordingly, the gate line 160 of each level may include a step portion protruding in the second direction from the gate line 160 at an upper level thereof, and the step portions of the gate lines 160 may be arranged on the first extension region E1.

The gate lines 160 may include a ground selection line (GSL), a word line and a string selection line (SSL). For example, a lowermost gate line 160a may serve as the GSL. An uppermost gate line 160f may serve as the SSL. The gate lines 160b to 160e between the GSL and the SSL may serve as the word lines.

The GSL (e.g., the gate line 160a) may laterally surround the semiconductor pattern 127. The word lines (e.g., the gate lines 160b to 160e) and the SSL (e.g., the gate line 160f) may laterally surround the channel 132 or the dielectric layer structure 130.

The gate lines may be formed at increased levels in consideration of a circuit design and a degree of integration of the vertical memory device, e.g. 16 levels, 24 levels, 32 levels, 48 levels, etc. The SSLs may be formed at two or more levels.

The gate line 160 may include a metal such as tungsten (W), a metal nitride and/or a metal silicide. In example embodiments, the gate line 160 may have a multi-layered structure including a metal nitride such as tungsten nitride, and a metal.

Insulating interlayer patterns 116 may be disposed between the gate lines 160 neighboring in the first direction. The insulating interlayer pattern 116 may include a silicon oxide-based material, e.g., silicon dioxide ($SiO_2$), silicon oxycarbide (SiOC) or silicon oxyfluoride (SiOF). The gate lines 160 included in one gate line stack structure may be insulated from each other by the insulating interlayer patterns 116. In example embodiments, the insulating interlayer patterns 116 may be stacked along the first direction in a pyramidal shape or a stepped shape substantially the same as or similar to that of the gate lines 160.

A peripheral circuit including, e.g., a transistor may be formed on the first peripheral region P1 of the substrate 100. The transistor may include a gate structure 108 and a first impurity region 103. The gate structure 108 may include a gate insulation pattern 102, a gate electrode 104 and a gate mask 106. In example embodiments, a peripheral circuit protection layer 109 may be formed on the first peripheral region P1.

A mold protection layer 120 covering stepped portions of the gate lines 160 may be formed on a lateral portion of the gate line stack structure. The mold protection layer 120 may also cover the peripheral circuit protection layer 109 on the first peripheral region P1.

The peripheral circuit protection layer 109 and the mold protection layer 120 may include an insulation material, e.g., silicon oxide.

A first upper insulation layer 140 may be formed on the mold protection layer 120, an uppermost insulating interlayer pattern 116*g* and the pads 137.

The cutting pattern 157 may be interposed between the gate line stack structures. An insulation pattern 155 may be formed on a sidewall of the cutting pattern 157. For example, the cutting pattern 157 and the insulation pattern 155 may extend through the first upper insulation layer 140, the gate lines 160, the insulating interlayer patterns 116 and the mold protection layer 120, and may extend in the second direction. The gate line stack structure including the number of the channel rows (e.g., 4 channel rows) may be defined by the cutting pattern 157 and the insulation pattern 155.

In example embodiments, the cutting pattern 157 may serve as a common source line (CSL) of the vertical memory device. The cutting pattern 157 and the gate lines 160 included in the gate line stack structure may be insulated from each other by the insulation pattern 155.

The cutting pattern 157 may include a metal, e.g., tungsten or copper. The insulation pattern 155 may include, e.g., silicon oxide.

An impurity region 105 (see FIG. 4) may be formed at an upper portion of the substrate 100 under the cutting pattern 157 and the insulation pattern 155. The first impurity region 105 may extend in the second direction together with the cutting pattern 157.

A second upper insulation layer 170 may be formed on the first upper insulation layer 140, and may cover the cutting pattern 157 and the insulation pattern 155.

The first contact 172 may extend through the second upper insulation layer 170, the first upper insulation layer 140, the mold protection layer 120 and/or the insulating interlayer pattern 116 to be electrically connected to the gate line 160 at each level.

In example embodiments, the first contacts 172 may be distributed on the first extension region E1, and may be electrically connected to the step portions of the gate lines 160. In example embodiments, the first contact 172 may be provided per each step portion of the gate lines 160 included in one gate line stack structure.

A bit line contact 174 electrically connected to the pad 137 may be disposed on the cell region C. For example, the bit line contact 174 may be formed through the second upper insulation layer 170 and the first upper insulation layer 140 to be in contact with the pad 137. A plurality of the bit line contacts 174 may be formed in an arrangement substantially the same as or similar to that of the pads 137.

In example embodiments, the peripheral circuit contact 176 may be formed on the first peripheral circuit region P1.

The peripheral circuit contact 176 may extend through, e.g., the second upper insulation layer 170, the first upper insulation layer 140, the mold protection layer 120 and the peripheral circuit protection layer 109, and may be electrically connected to the first impurity region 103.

The first wiring 180 may be disposed on the second upper insulation layer 170 to be electrically connected to the first contact 172. In example embodiments, the first wirings 180 may be provided based on the number of the gate lines 160 included in one of the gate lines stack structure. For example, six first wirings 180 may correspond to the one of the gate line stack structure.

In example embodiments, the first wiring 180 may extend in the second direction throughout the first extension region E1 and the first peripheral region P1, and may be also electrically connected to the peripheral circuit contact 176 via the wiring pad 181 (see FIG. 2).

The bit line 182, the dummy wiring 184 and the identification pattern 186 may be disposed on the second upper insulation layer 170 as described with reference to FIG. 2. In example embodiments, the bit line 182, the first wiring 180, the dummy wiring 184 and the identification pattern 186 may be located at substantially the same level.

Figure 5:
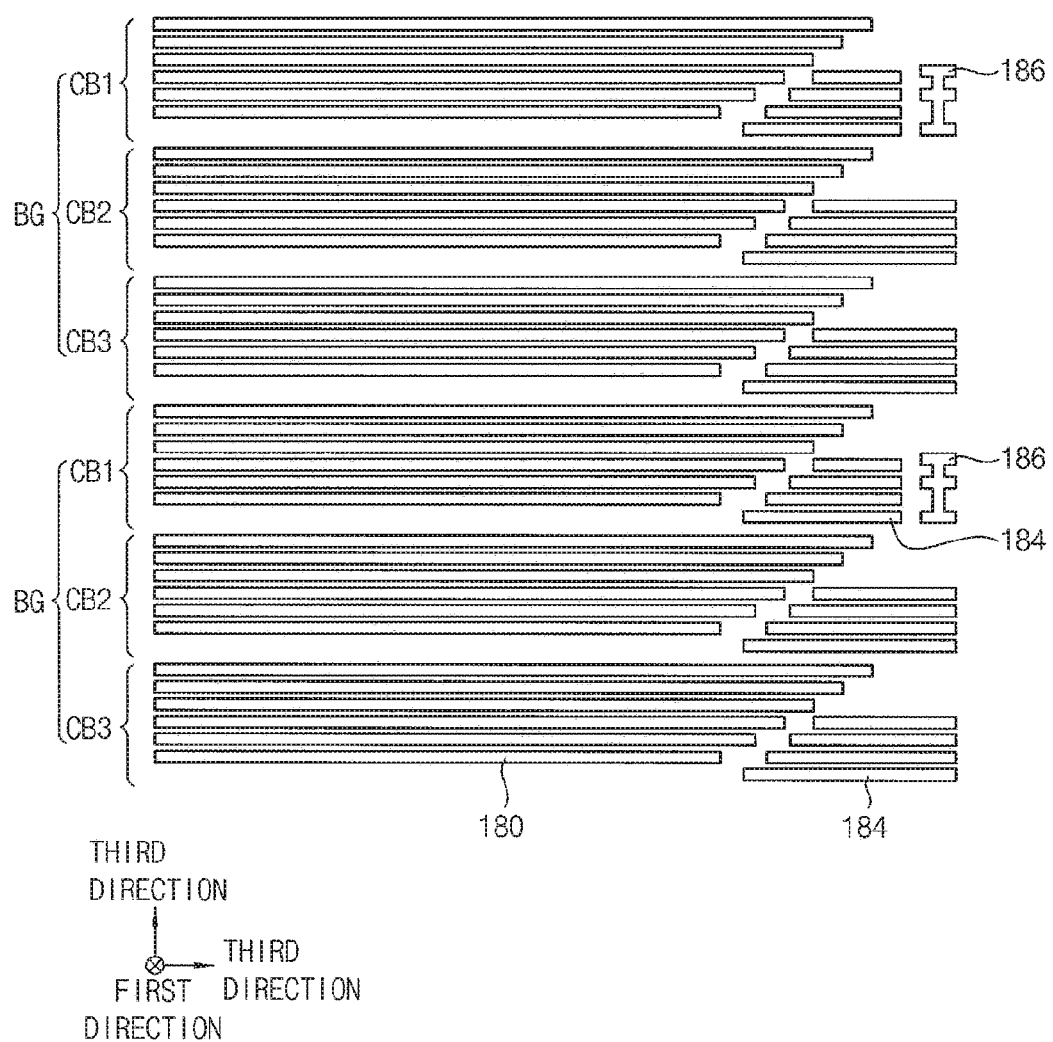
FIG. 5 is a schematic view illustrating an arrangement of wirings included in cell blocks.

FIG. 5 is a schematic view illustrating an arrangement of wirings included in cell blocks.

As described with reference to FIGS. 1 to 4, the first wirings 180 and the dummy wirings 184 may be included in each cell block, and a plurality of the cell blocks may be repeatedly arranged along the third direction. Thus, wirings may be repeatedly arranged along the third direction in substantially the same or similar patterns.

Referring to FIG. 5, for example, first to third cell blocks CB1, CB2 and CB3 may define one block group BG, and a plurality of the block groups BG may be arranged along the third direction.

In example embodiments, at least one identification pattern 186 may be provided in each block group BG. For example, the identification pattern 186 may be provided in the first cell block CB1 of each block group BG.

As described above, the wirings arranged in the repeated patterns may be divided based on the cell block and the block group BG, and the identification pattern 186 may be inserted in each block group. Thus, an address identification may be easily conducted when applying a signal, detecting defects, etc., and a desired cell block may be selected precisely.

The number of the cell blocks included in the block group BG, and a location and a shape of the identification pattern 186 may not be limited as illustrated in FIG. 5.

FIGS. 6 to 9 illustrate shapes of identification patterns in accordance with example embodiments.

Figure 6:
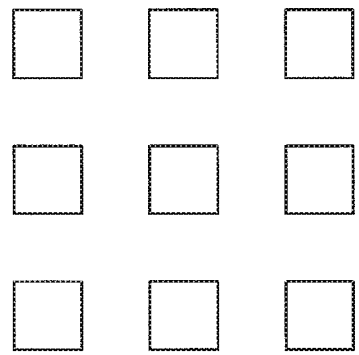
FIGS. 6 to 9 illustrate shapes of identification patterns in accordance with example embodiments.

Referring to FIG. 6, an identification pattern 286*a* may include a combination of a plurality of dot patterns or island patterns. Thus, the identification pattern 286*a* may be easily differentiated from the adjacent wirings having a linear shape.

Figure 7:
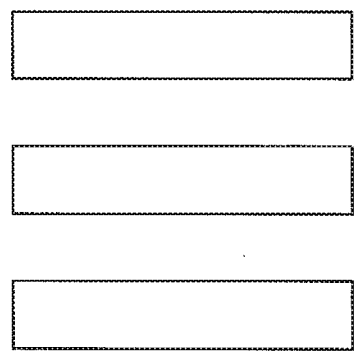

Referring to FIG. 7, an identification pattern 286*b* may include a combination of line patterns extending in the same direction. The line pattern included in the identification pattern 286*b* may be shorter than the adjacent wiring (e.g., the first wiring 180 and the dummy wiring 184). Thus, the identification pattern 286*b* may be easily differentiated from the adjacent wirings.

Figure 8:
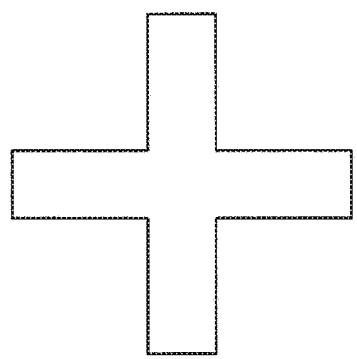

Referring to FIG. 8, an identification pattern 286*c* may include line patterns extending in different direction. For example, the identification pattern 286*c* may include line patterns crossing each other.

Figure 9:
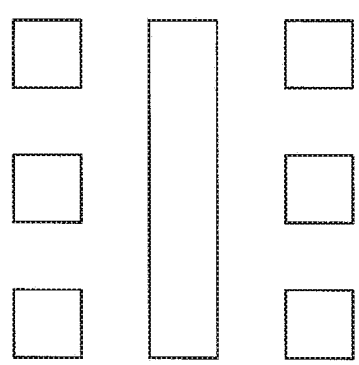

Referring to FIG. 9, an identification pattern 286d may include a combination of a plurality of dot patterns or island patterns and at least one line pattern.

However, the shape of the identification pattern may be properly modified in consideration of distinctiveness relative to the adjacent wirings.

In example embodiments, the identification pattern may have a character (or letter) shape, e.g., one of alphabet characters or Korean characters. In example embodiments, the identification pattern may have a shape conferring an order, e.g., a number or a Roman alphabet.

FIGS. 10 to 35 are cross-sectional views and top plan views illustrating a method of manufacturing a vertical memory device in accordance with example embodiments. For example, FIGS. 10 to 35 illustrate a method of manufacturing the vertical memory device illustrated in FIGS. 1 to 4.

Specifically, FIGS. 13, 20, 24, 27, 31 and 33 are top plan views illustrating the method. FIGS. 10, 11, 12, 14, 16, 18, 22, 25, 29, 32 and 34 are cross-sectional views taken along a line I-I' designated in the top plan views and along the first direction. FIGS. 15, 17, 19, 21, 23, 26, 28, 30 and 35 are cross-sectional views taken along a line II-II' designated in the top plan views and along the first direction.

For convenience of descriptions, an illustration of some insulating structures is omitted in FIGS. 13, 20, 24, 27, 31 and 33.

Figure 10:
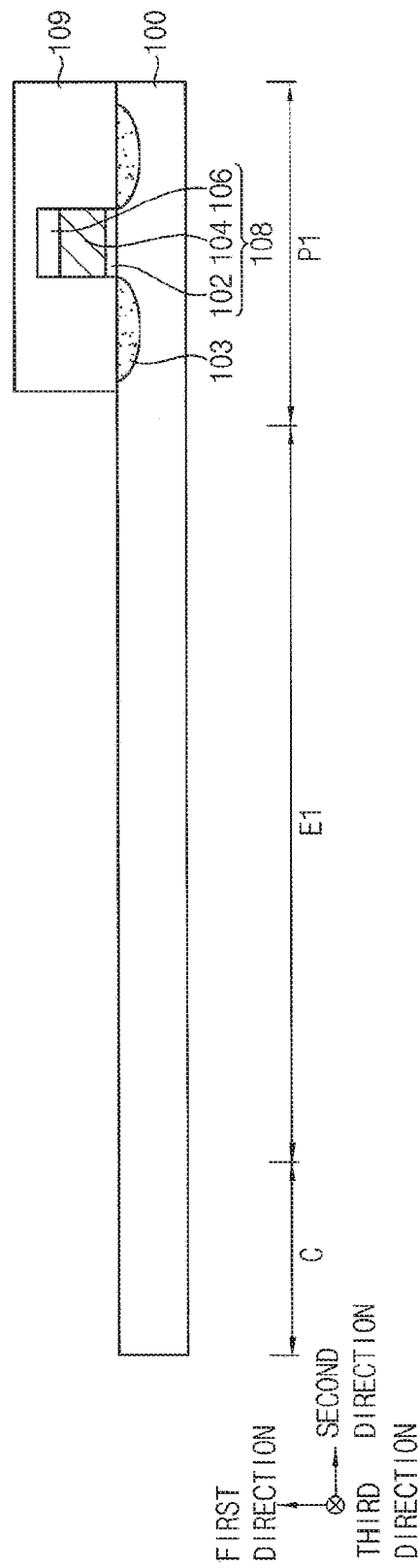

Referring to FIG. 10, a peripheral circuit may be formed on a substrate 100.

As described with reference to FIG. 1, the substrate 100 may include a cell region C, first and second extension regions E1 and E2, and first and second peripheral regions P1 and P2. In example embodiments, the peripheral circuit may be formed on the first peripheral region P1 adjacent to the first extension region E1.

The substrate 100 may include a semiconductor (e.g., single crystalline silicon or single crystalline germanium) and may serve as a body and/or a p-type well of the vertical memory device. The peripheral circuit may include, e.g., a transistor defined by a gate structure 108 and a first impurity region 103.

For example, a gate insulation layer, a gate electrode layer and a gate mask layer may be sequentially formed on the substrate 100. The gate mask layer may be partially etched to form a gate mask 106. The gate electrode layer and the gate insulation layer may be partially etched using the gate mask 106 as an etching mask to form a gate electrode 104 and a gate insulation pattern 102. Accordingly, the gate structure 108 including the gate insulation pattern 102, the gate electrode 104 and the gate mask 106 sequentially stacked on the substrate 100 may be formed.

The gate insulation layer may be formed of silicon oxide or a metal oxide. The gate electrode layer may be formed of a metal, a metal nitride, a metal silicide or doped polysilicon. The gate mask layer may be formed of silicon nitride. The gate insulation layer, the gate electrode layer and the gate mask layer may be formed by at least one of a chemical vapor deposition (CVD) process, a plasma enhanced chemical vapor deposition (PECVD) process, a high density plasma chemical vapor deposition (HDP-CVD) process, an atomic layer deposition (ALD) process or a sputtering process. In example embodiments, the gate insulation layer may be formed by performing a thermal oxidation process on a top surface of the substrate 100.

An ion-implantation process may be performed using the gate structure 108 as an implantation mask to form the first impurity region 103 at an upper portion of the substrate 100 in the first peripheral region P1 adjacent to the gate structure 108.

In example embodiments, a spacer including, e.g., silicon nitride may be further formed on a sidewall of the gate structure 108.

A peripheral circuit protection layer 109 covering the transistor may be further formed. For example, a protection layer covering the first impurity region 103 and the gate structure 108 may be formed on the substrate 100. A portion of the protection layer formed on the cell region C and the first extension region E1 may be removed to form the peripheral circuit protection layer 109. The protection layer may be formed as an oxide layer.

Figure 11:
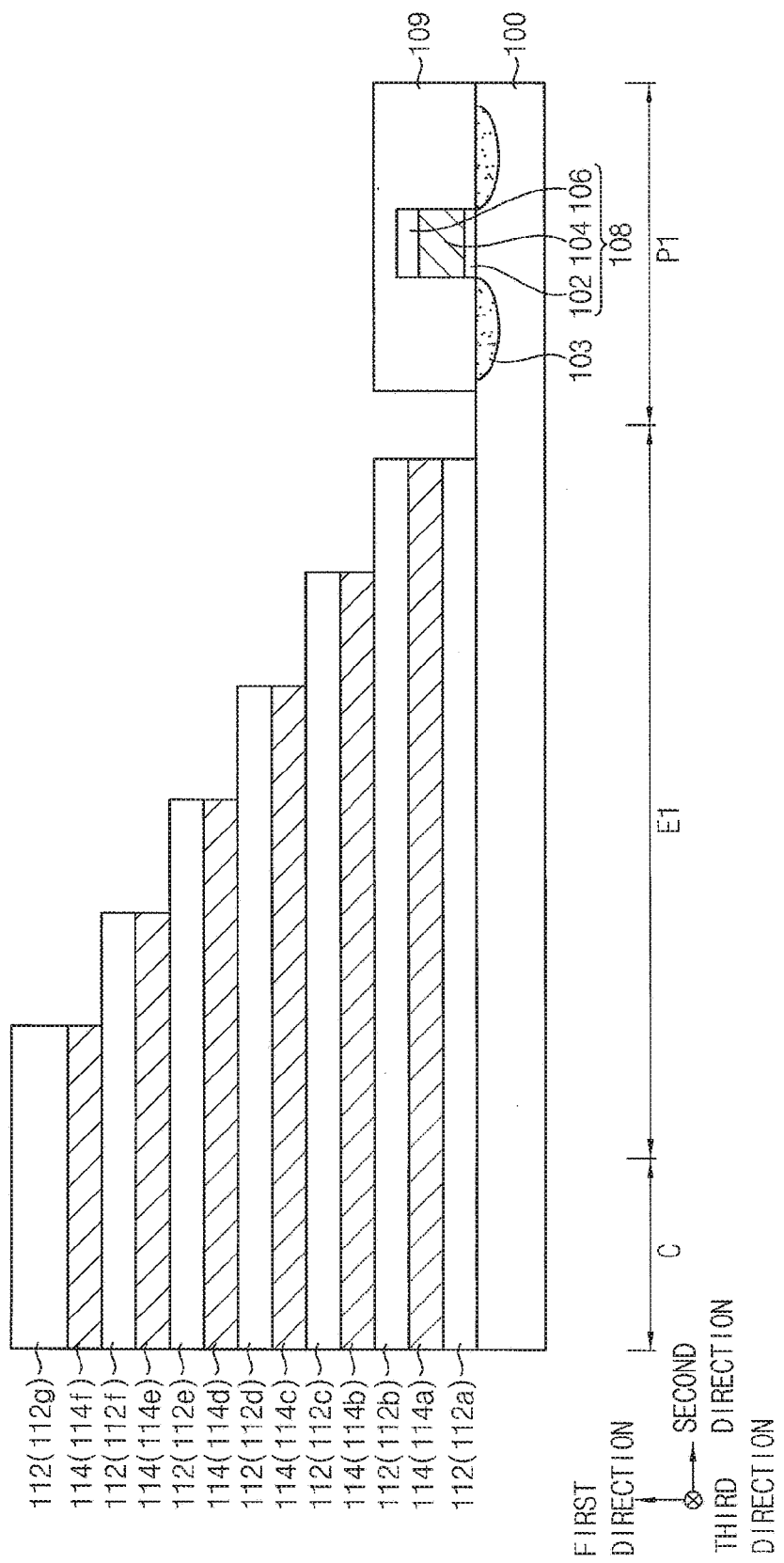

Referring to FIG. 11, a stepped mold structure may be formed on the cell region C and the extension regions E1 and E2 of the substrate 100.

In example embodiments, insulating interlayers 112 (e.g., 112a through 112g) and sacrificial layers 114 (e.g., 114a through 114f) may be formed on the substrate 100 to form a mold structure.

The insulating interlayer 112 may be formed of an oxide-based material, e.g., silicon dioxide, silicon oxycarbide and/or silicon oxyfluoride. The sacrificial layer 114 may be formed of a material that may have an etching selectivity with respect to the insulating interlayer 112 and may be easily removed by a wet etching process. For example, the sacrificial layer 114 may be formed of a nitride-based material, e.g., silicon nitride and/or silicon boronitride.

The insulating interlayer 112 and the sacrificial layer 114 may be formed by a CVD process, a PECVD process, a spin coating process, etc. In example embodiments, a lowermost insulating interlayer 112a may be formed by a thermal oxidation process or a radical oxidation process on a top surface of the substrate 100. In example embodiments, an uppermost insulating interlayer 112g may be formed to have a relatively large thickness in consideration of a formation of a pad 137 (see FIG. 18).

The sacrificial layers 114 may be removed in a subsequent process to provide spaces for a GSL, a word line and an SSL. Thus, the number of the insulating interlayers 112 and the sacrificial layers 114 may be determined in consideration of the number of the GSL, the word line and the SSL. FIG. 11 illustrates that the sacrificial layers 114 and the insulating interlayers 112 are formed at 6 levels and 7 levels, respectively. However, the number of the insulating interlayers 112 and the sacrificial layers 114 may increase or decrease depending on a desired degree of integration of the vertical memory device.

Subsequently, a lateral portion of the mold structure may be partially etched in, e.g., a stepwise manner to form the stepped mold structure.

For example, a photoresist pattern (not illustrated) covering the cell region C and the extension regions E1 and E2 may be formed on the uppermost insulating interlayer 112g. Peripheral portions of the uppermost insulating interlayer 112g and an uppermost sacrificial layer 114f may be removed using the photoresist pattern as an etching mask. A peripheral portion of the photoresist pattern may be partially removed so that a width of the photoresist pattern may be reduced. Peripheral portions of insulating interlayers 112g and 112f, and sacrificial layers 114f and 114e may be etched using the photoresist pattern again as an etching mask. Etching processes may be repeated with a desired (and/or alternatively predetermined) etching amount in a similar manner as described above to obtain the stepped mold structure illustrated in FIG. 11, and the peripheral regions P1 and P2 and the peripheral circuit protection layer 109 may be exposed again.

Figure 12:
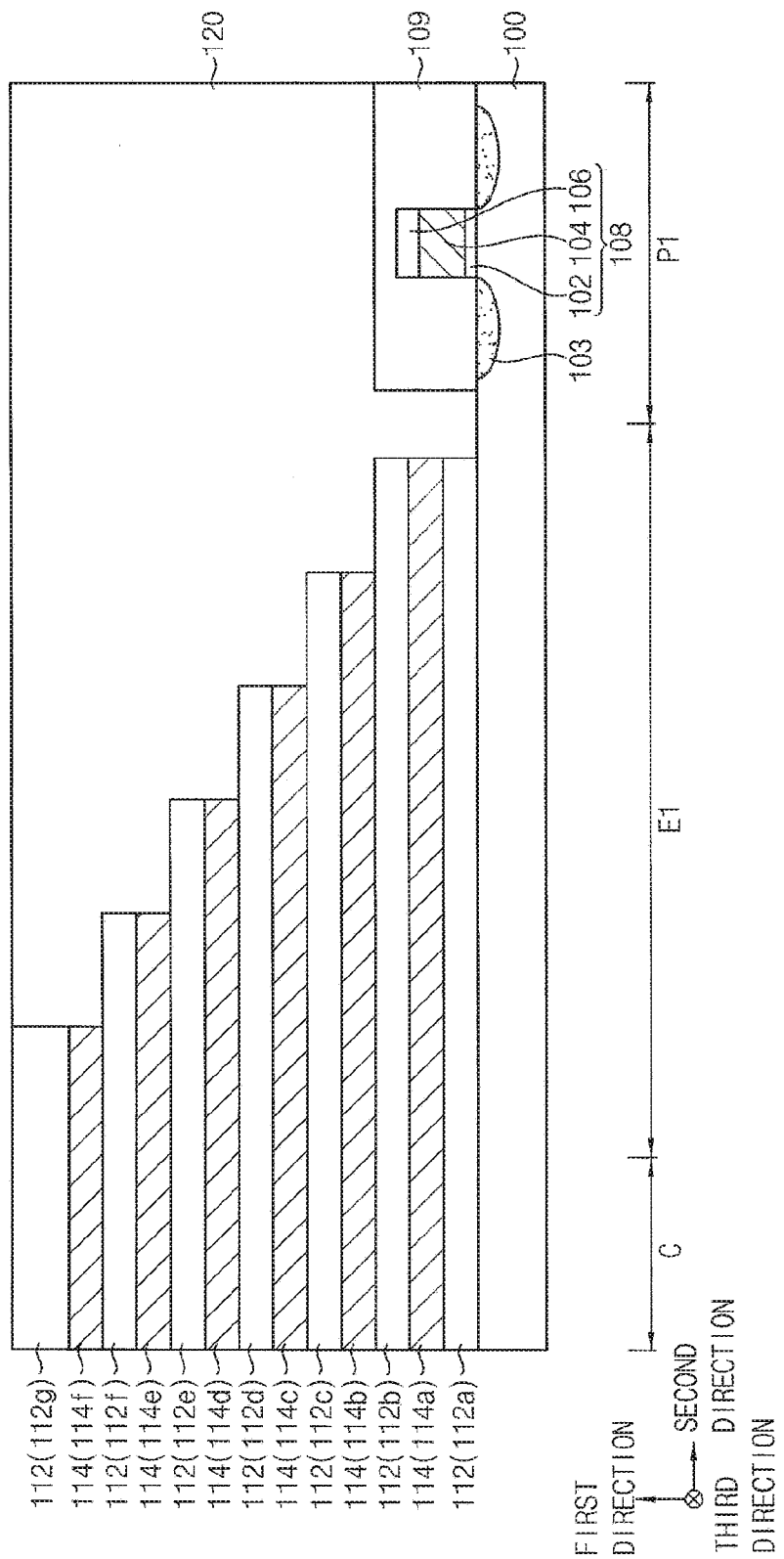

Referring to FIG. 12, a mold protection layer 120 covering a lateral portion of the stepped mold structure may be formed on the substrate 100 and the peripheral circuit protection layer 109.

For example, an insulation layer covering the stepped mold structure and the peripheral circuit protection layer 109 may be formed on the substrate 100 using, e.g., silicon oxide by a CVD process or a spin coating process. An upper portion of the insulation layer may be planarized until the uppermost insulating interlayer 112g is exposed to form the mold protection layer 120. The planarization process may include a chemical mechanical polish (CMP) process and/or an etch-back process.

In example embodiments, the mold protection layer 120 may be formed of a material substantially the same as or similar to that of the insulating interlayer 112. In this case, the mold protection layer 120 may be integral or merged with the insulating interlayer 112.

Figure 13:
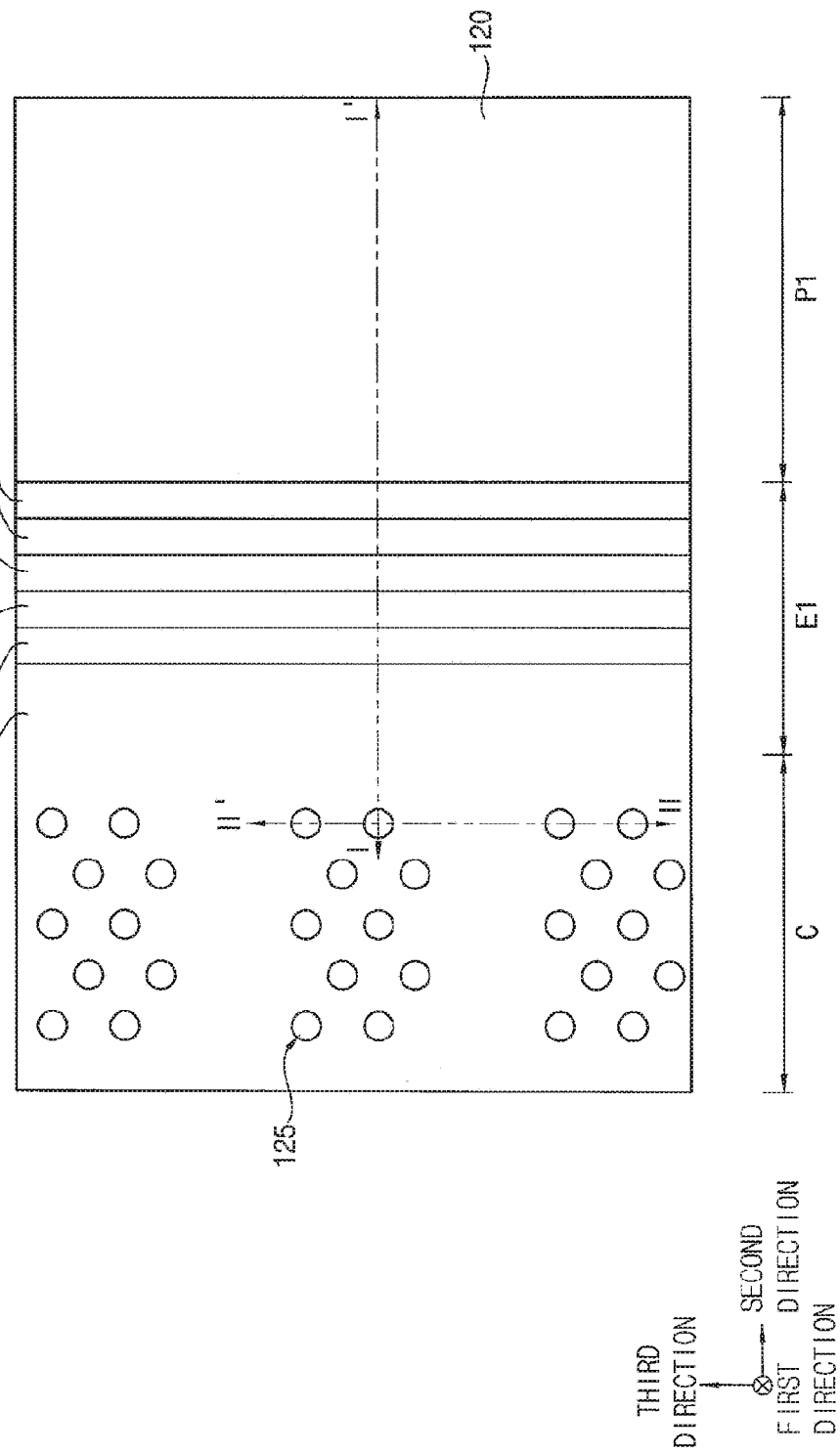
Figure 14:
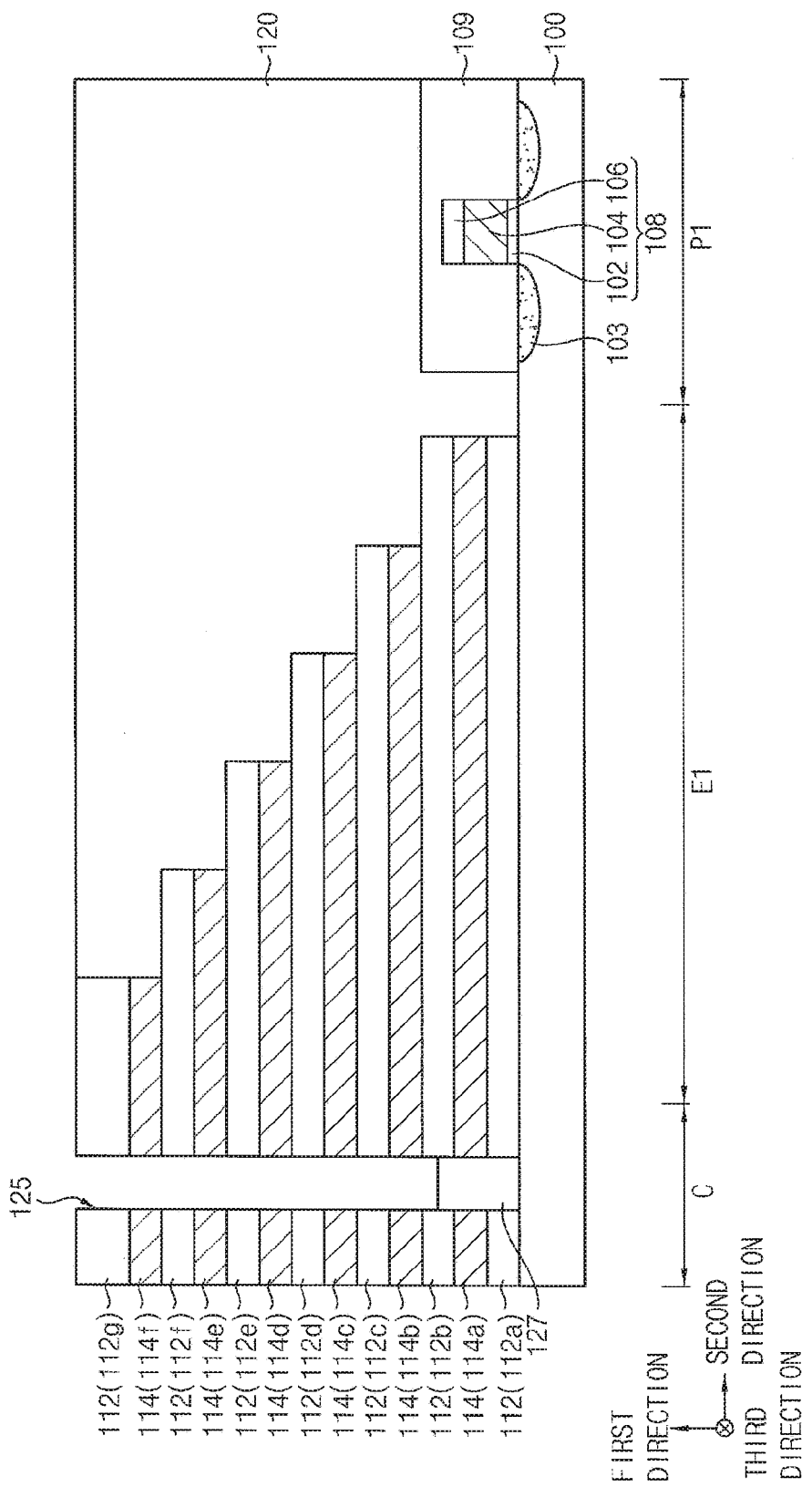

Referring to FIGS. 13 to 15, channel holes 125 may be formed through the stepped mold structure on the cell region C.

For example, a hard mask (not illustrated) may be formed on the uppermost insulating interlayer 112g and the mold protection layer 120. The insulating interlayers 112 and the sacrificial layers 114 of the stepped mold structure may be partially etched by performing, e.g., a dry etching process. The hard mask may be used as an etching mask to form the channel hole 125. The channel hole 125 may extend in the first direction from the top surface of the substrate 100, and the top surface of the substrate 100 may be partially exposed by the channel hole 125. The hard mask may be formed of silicon-based or carbon-based spin-on hardmask (SOH) materials, and/or a photoresist material. The hard mask may be removed by an ashing process and/or a strip process after the formation of the channel holes 125.

As illustrated in FIGS. 13, 14, and 15, a plurality of the channel holes 125 may be formed in the second direction to form a channel hole row. A plurality of the channel hole rows may be formed in the third direction. The channel hole rows may be arranged such that the channel holes 125 may be formed in a zigzag arrangement along the second direction and/or the third direction.

In example embodiments, a semiconductor pattern 127 may be formed at a lower portion of the channel hole 125. For example, the semiconductor pattern 127 may be formed by a selective epitaxial growth (SEG) process using the top surface of the substrate 100 exposed through the channel hole 125 as a seed. In example embodiments, a top surface of the semiconductor pattern 127 may be positioned between a top surface of a first sacrificial layer 114a and a bottom surface of a second sacrificial layer 114b.

Figure 16:
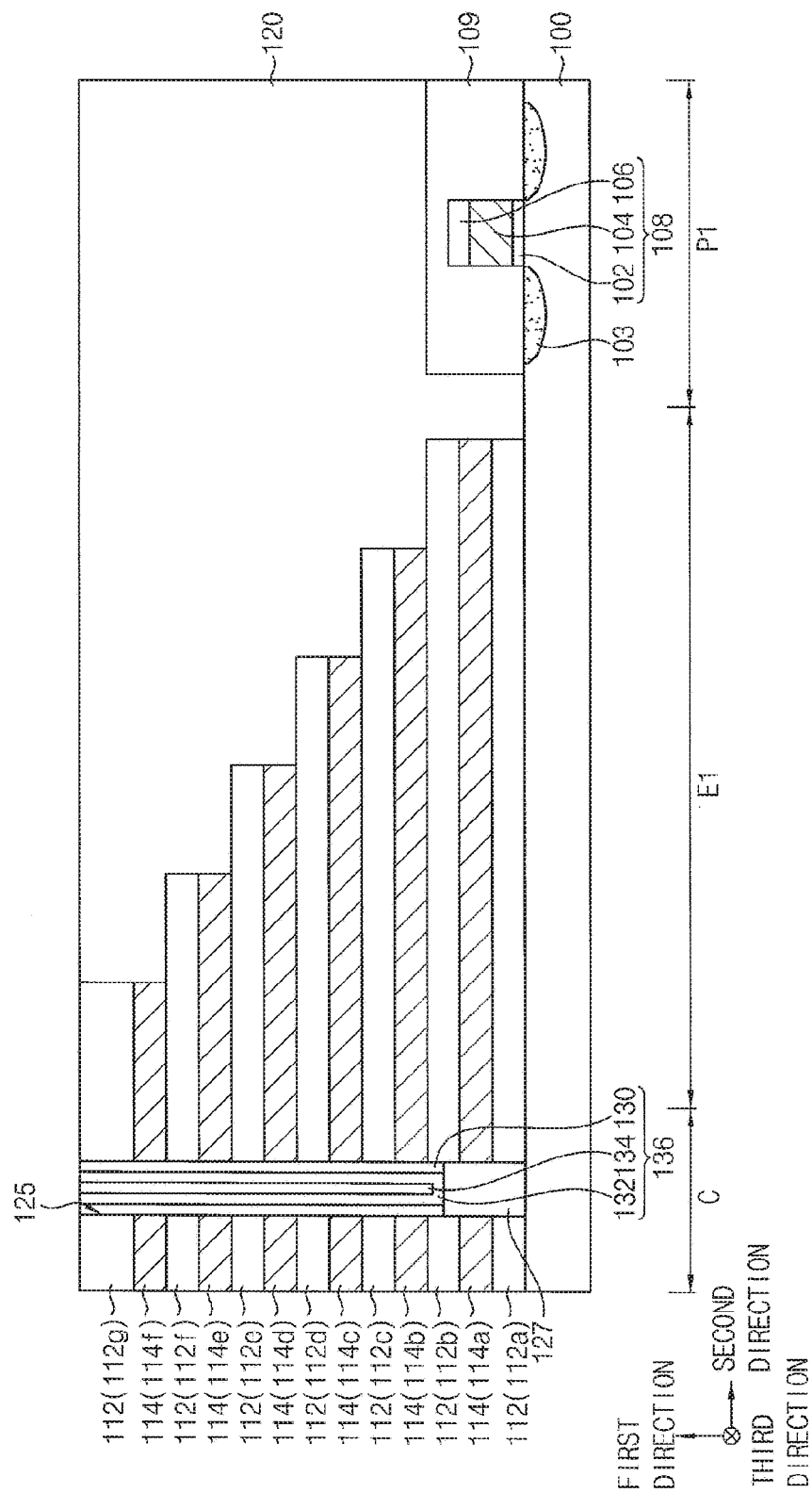

Referring to FIGS. 16 and 17, a vertical channel structure 136 filling the channel hole 125 may be formed on the semiconductor pattern 127.

In example embodiments, a dielectric layer may be formed along sidewalls of the channel holes 125, and top surfaces of the uppermost insulating interlayer 112g, the semiconductor pattern 127 and the mold protection layer 120. Upper and lower portions of the dielectric layer may be removed by an etch-back process to form a dielectric layer structure 130 on the sidewall of the channel hole 125.

A channel layer and a filling insulation layer filling remaining portions of the channel holes 125 may be sequentially formed along the top surfaces of the uppermost insulating interlayer 112g and the mold protection layer 120, an inner wall of the dielectric layer structure 130, and the top surface of the semiconductor pattern 127. Upper portions of the channel layer and the filling insulation layer may be planarized by, e.g., a CMP process until the uppermost insulating interlayer 112g and/or the mold protection layer 120 may be exposed. Accordingly, the vertical channel structure 136 including the dielectric layer structure 130, a channel 132 and a filling insulation pattern 134 may be formed in each channel hole 125.

The dielectric layer may be formed by sequentially forming a blocking layer, a charge storage layer and a tunnel insulation layer. In example embodiments, the dielectric layer may be formed as an oxide-nitride-oxide (ONO) layered structure. The blocking layer, the charge storage layer and the tunnel insulation layer may be formed by a CVD process, a PECVD process, an ALD process, etc.

The channel layer may be formed of polysilicon or amorphous silicon which is optionally doped with impurities. In example embodiments, a heat treatment or a laser beam irradiation may be further performed on the channel layer. In this case, the channel layer may be transformed to include single crystalline silicon. The filling insulation layer may be formed using, e.g., silicon oxide or silicon nitride. The channel layer and the filling insulation layer may be formed by a CVD process, a PECVD process, an ALD process, a PVD process, a sputtering process, etc.

The dielectric layer structure 130 may have a straw shape or a cylindrical shell shape surrounding an outer sidewall of the channel 132. The channel 132 may have a substantially cup shape. The filling insulation pattern 134 may have a pillar shape inserted in the channel 132.

Figure 18:
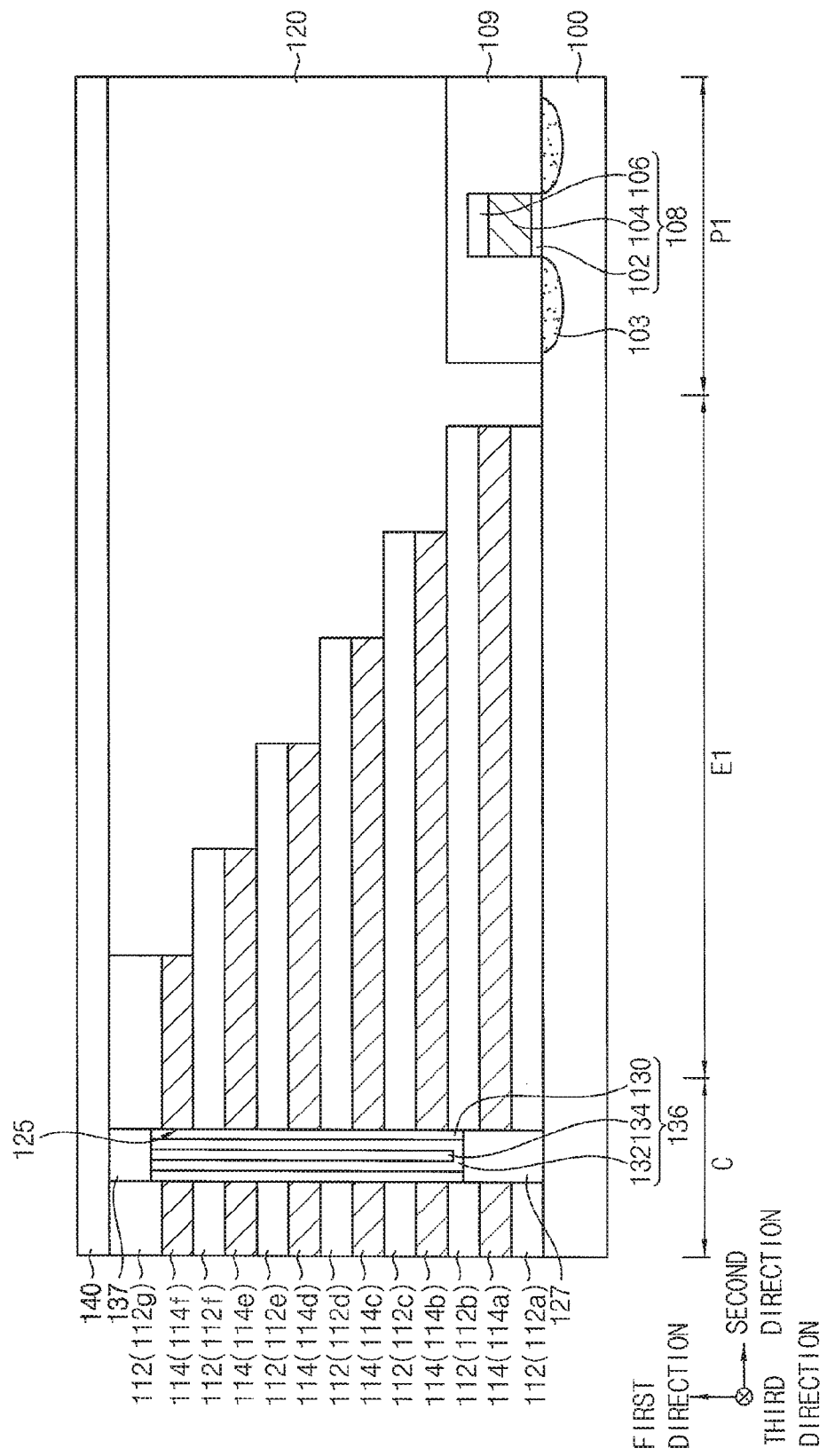
Figure 19:
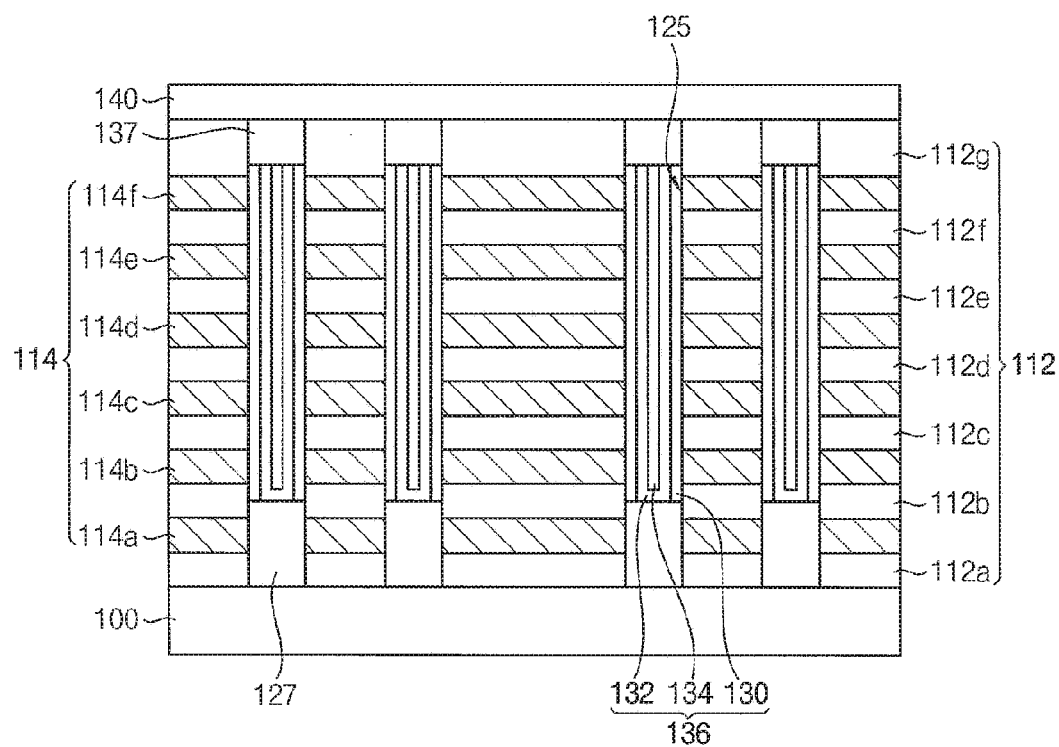

Referring to FIGS. 18 and 19, the pad 137 capping an upper portion of the channel hole 125 may be formed.

For example, an upper portion of the vertical channel structure 136 may be partially removed by, e.g., an etch-back process to form a recess. A pad layer may be formed on the dielectric layer structure 130, the channel 132, the filling insulation pattern 134, the uppermost insulating interlayer 112g and the mold protection layer 120 to sufficiently fill the recess. An upper portion of the pad layer may be planarized by, e.g., a CMP process until top surfaces of the uppermost insulating interlayer 112g and/or the mold protection layer 120 may be exposed to form the pad 137 from a remaining portion of the pad layer.

For example, the pad layer may be formed using polysilicon optionally doped with n-type impurities by a sputtering process or an ALD process. In example embodiments, a preliminary pad layer including amorphous silicon may be formed, and then a crystallization process may be performed thereon to form the pad layer.

According to the arrangement of the channel row, a plurality of the pads 137 may define a pad row in the uppermost insulating interlayer 112g, and a plurality of the pad rows may be formed along the third direction. A channel row may be defined under the pad row, and a plurality of the channel rows may be arranged along the third direction.

A first upper insulation layer 140 may be formed on the uppermost insulating interlayer 112g, the pads 137 and the mold protection layer 120. The first upper insulation layer 140 may be formed of silicon oxide by a CVD process, a spin coating process, etc.

Figure 20:
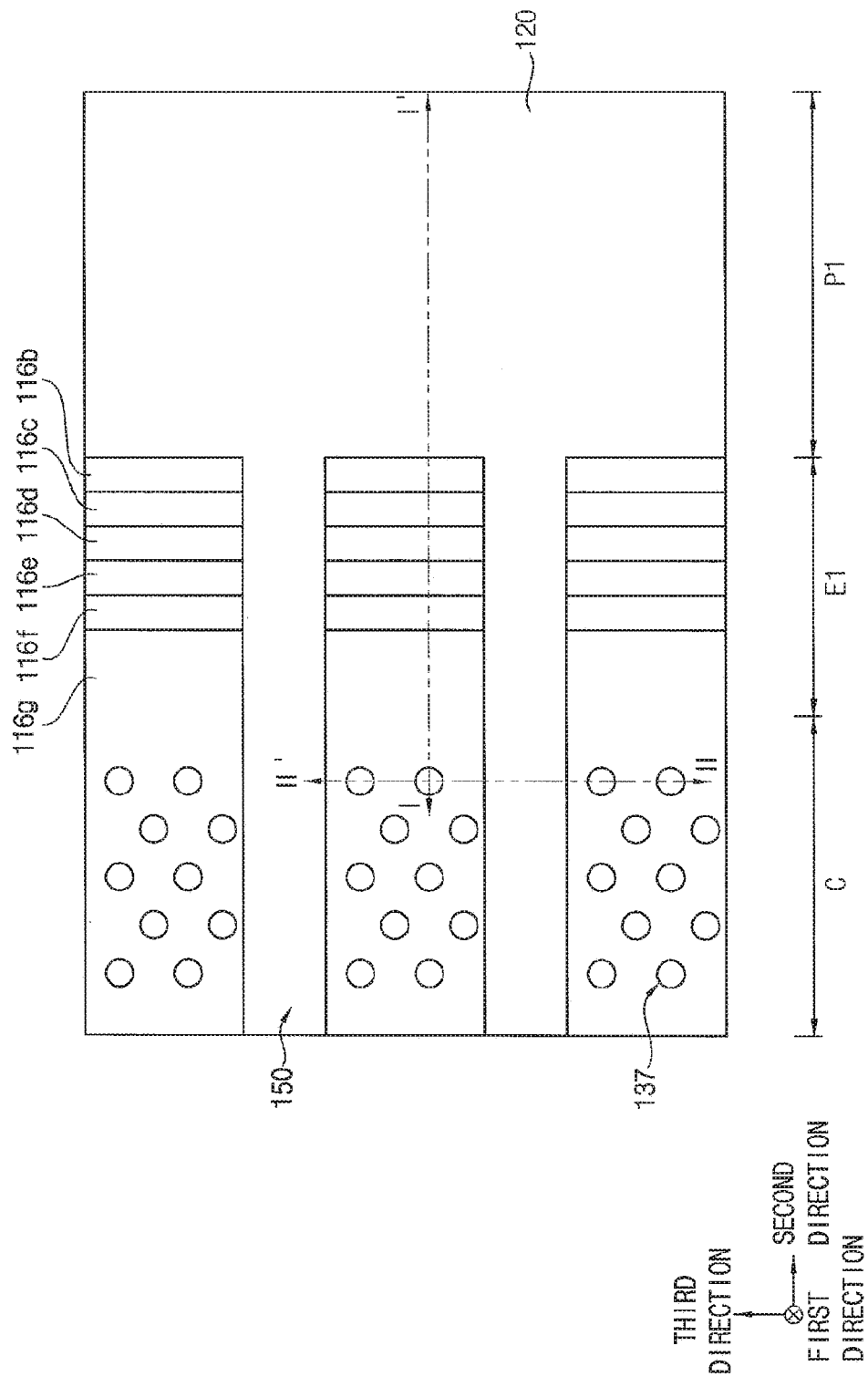

Referring to FIGS. 20 and 21, an opening 150 extending through the stepped mold structure may be formed.

For example, a hard mask (not illustrated) covering the pads 137 and partially exposing the first upper insulation layer 140 between some of the channel rows may be formed.

The first upper insulation layer 140, the mold protection layer 120, the insulating interlayers 112 and the sacrificial layers 114 may be partially etched by, e.g., a dry etching process using the hard mask as an etching mask to form the opening 150. The hard mask may be formed using a photoresist material or an SOH material. The hard mask may be removed by an ashing process and/or a strip process after the formation of the opening 150.

For example, the opening 150 may extend in the second direction, and a plurality of the openings 150 may be formed along the third direction. The number of the channel rows may be arranged between the openings 150 neighboring in the third direction. For example, as illustrated in FIG. 20, four channel rows may be included between the neighboring openings 150. However, the number of the channel rows between the openings 105 may be properly adjusted in consideration of a circuit design or a degree of integration of the vertical memory device.

As illustrated in FIG. 21, after the formation of the opening 150, the insulating interlayers 112 and the sacrificial layers 114 may be changed into insulating interlayer patterns 116 (e.g., 116a through 116g) and sacrificial patterns 118 (e.g., 118a through 118f). The insulating interlayer pattern 116 and the sacrificial pattern 118 at each level may have a plate shape extending in the second direction.

In example embodiments, the top surface of the substrate 100, and sidewalls of the insulating interlayer patterns 116 and the sacrificial patterns 118 may be exposed through the opening 150.

Figure 22:
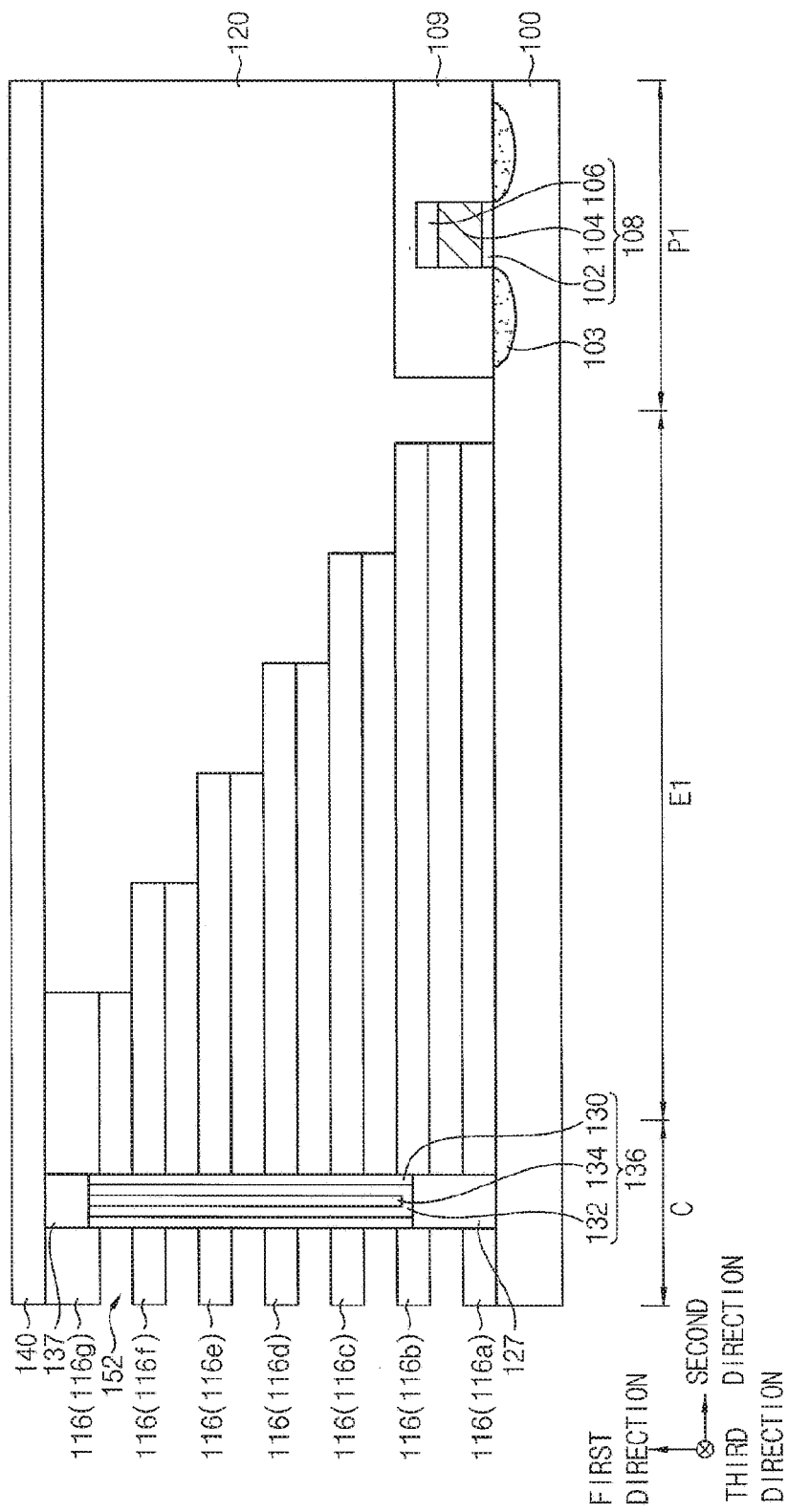
Figure 23:
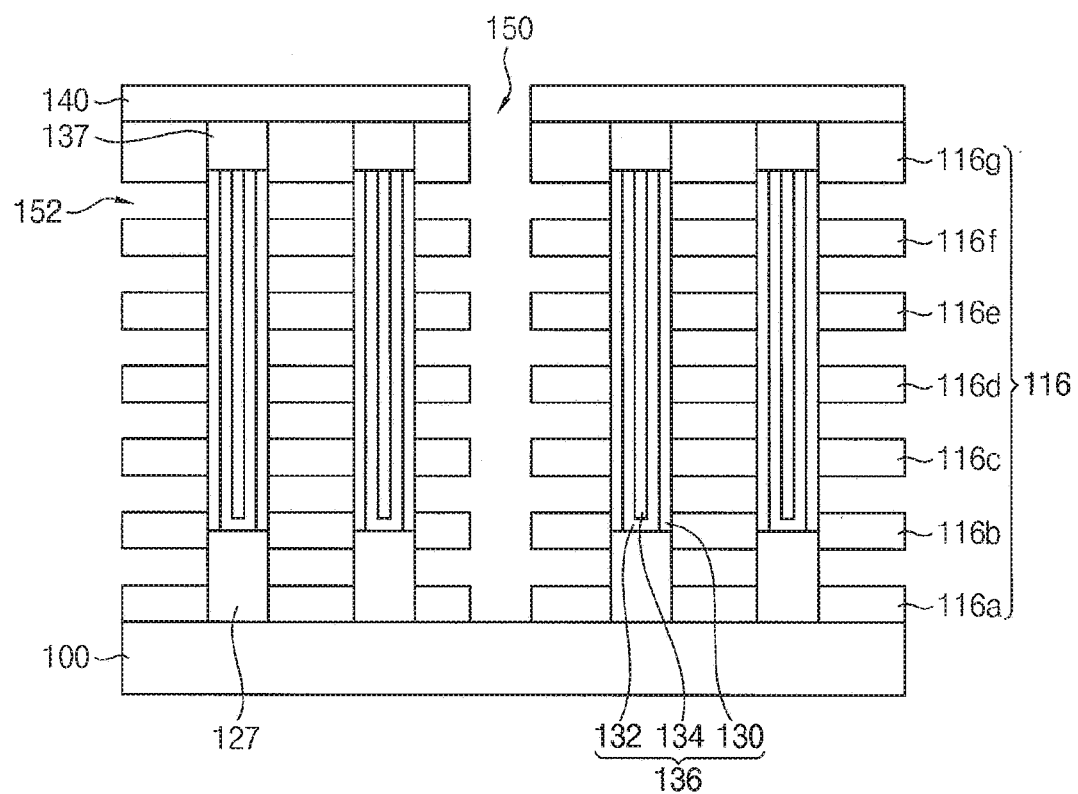

Referring to FIGS. 22 and 23, the sacrificial patterns 118 exposed by the opening 150 may be removed. In example embodiments, the sacrificial patterns 118 may be removed by a wet etching process using, e.g., phosphoric acid as an etchant solution.

A gap 152 may be defined by a space from which the sacrificial pattern 118 is removed. A sidewall of the vertical channel structure 136 may be partially exposed by the gap 152. In example embodiments, a sidewall of the semiconductor pattern 127 may be exposed by a lowermost gap 152.

As illustrated in FIG. 22, the gap 152 may extend in the second direction at each level, and may be blocked by the mold protection layer 120.

Figure 24:
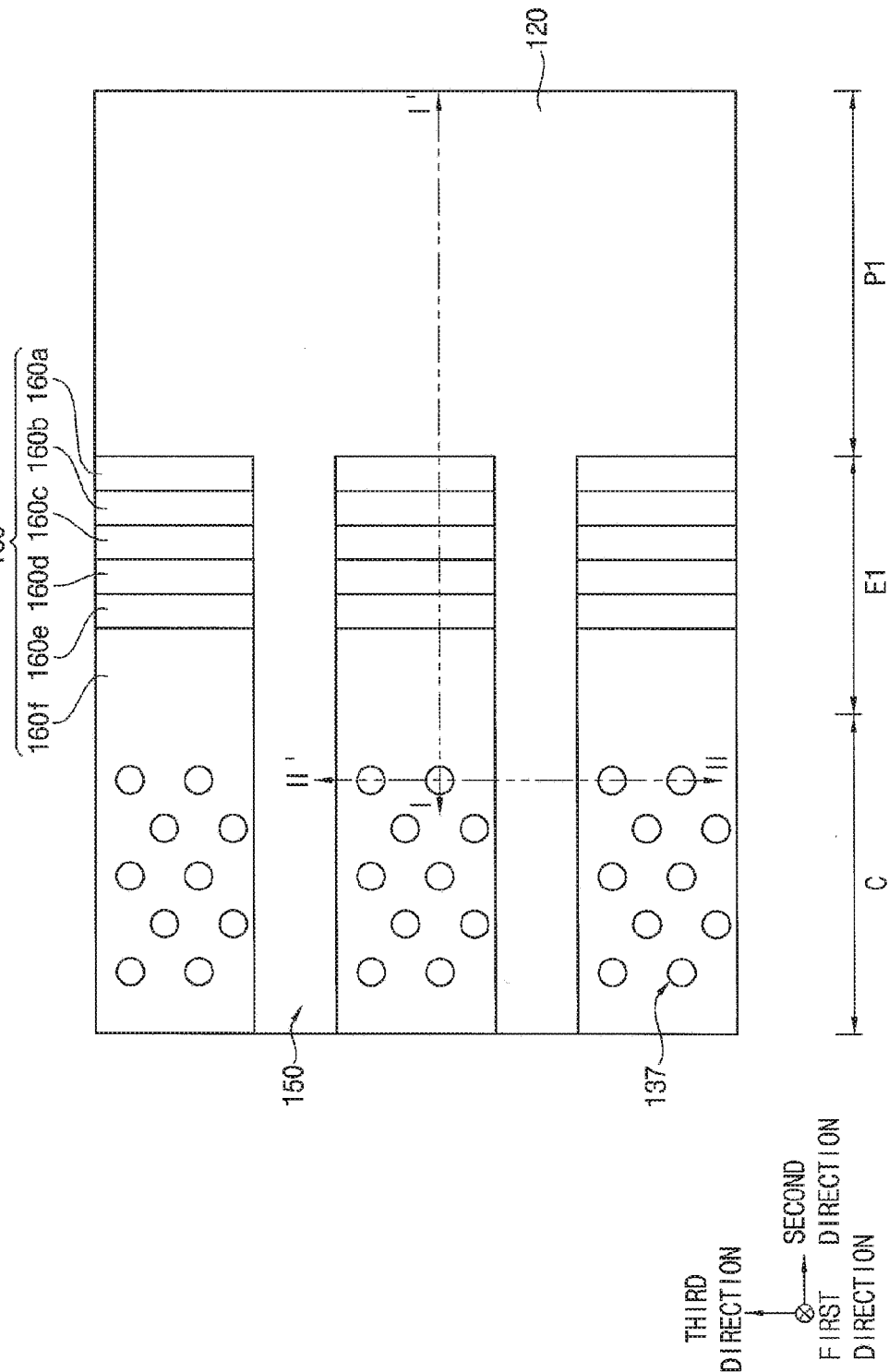
Figure 25:
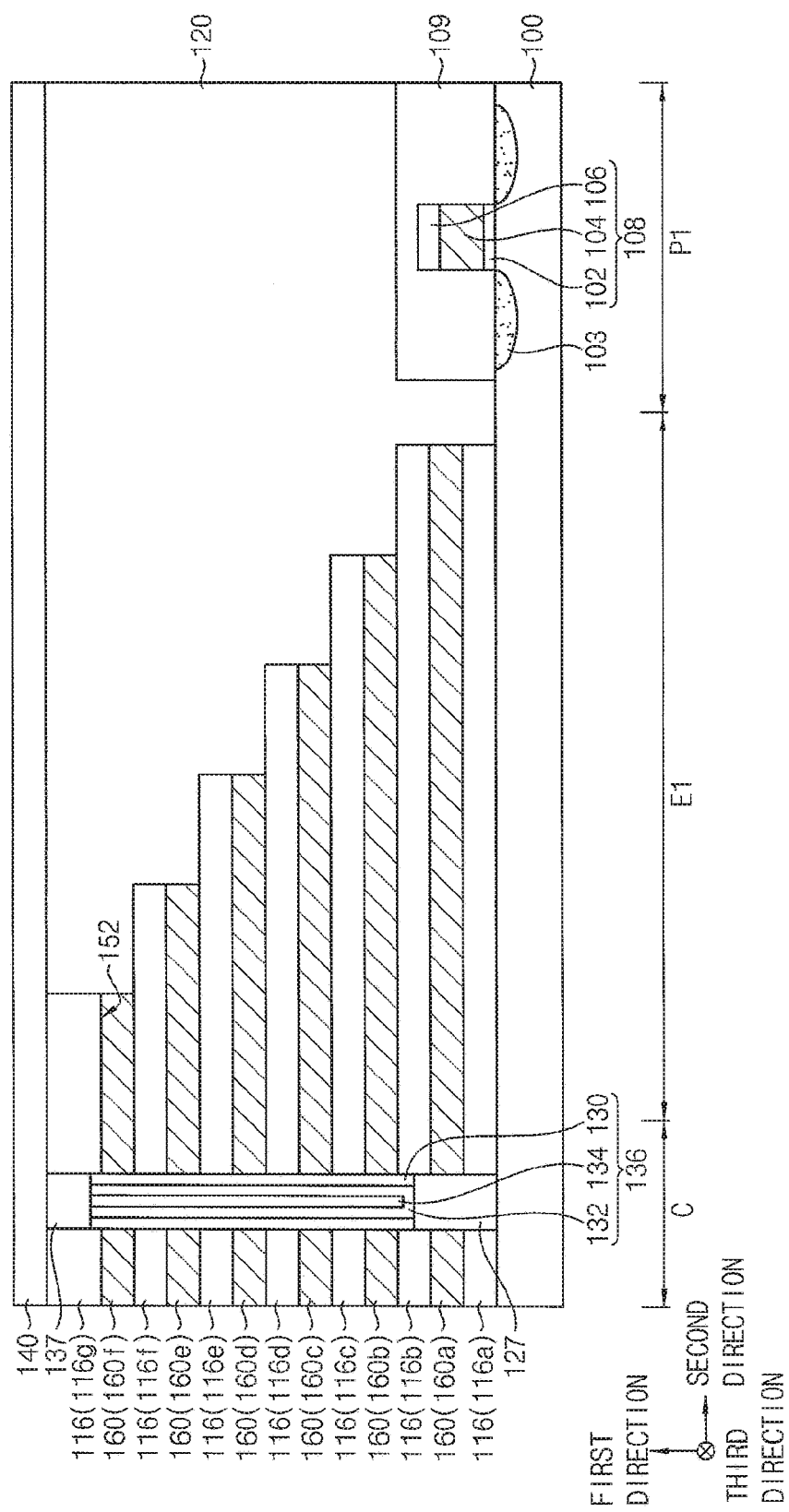
Figure 26:
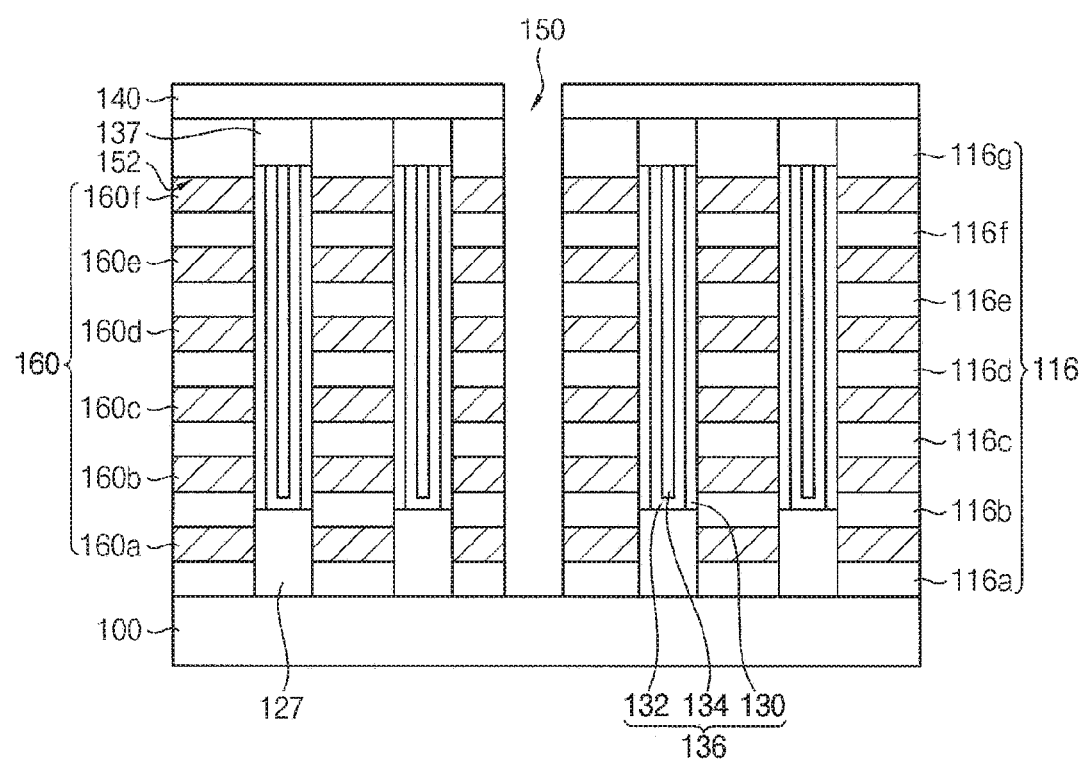

Referring to FIGS. 24 to 26, gate lines 160 (e.g., 160a through 160f) may be formed in the gaps 152. Accordingly, the sacrificial layer 114 and the sacrificial pattern 118 of each level may be replaced with the gate line 160.

In example embodiments, a gate electrode layer may be formed on the exposed outer sidewalls of the vertical channel structures 136, surfaces of the insulating interlayer patterns 116, the top surface of the substrate 100 exposed through the opening 150, and a top surface of the first upper insulation layer 140. The gate electrode layer may sufficiently fill the gaps 152 and at least partially fill the opening 150.

The gate electrode layer may be formed using a metal or a metal nitride. For example, the gate electrode layer may be formed of tungsten, tungsten nitride, titanium, titanium nitride, tantalum, tantalum nitride, platinum, etc. In example embodiments, the gate electrode layer may be formed as a multi-layered structure including a barrier layer formed of a metal nitride, and a metal layer. The gate electrode layer may be formed by a CVD process, a PECVD process, an ALD process, a PVD process, a sputtering process, etc.

In example embodiments, an interface layer (not illustrated) may be formed along inner walls of the gaps 152 and the surfaces of the insulating interlayer patterns 116 prior to the formation of the gate electrode layer. The interface layer may be formed of silicon oxide or a metal oxide.

Subsequently, the gate electrode layer may be partially removed to form the gate line 160 in the gap 152 at each level.

For example, an upper portion of the gate electrode layer may be planarized by a CMP process until the first upper insulation layer 140 may be exposed. Portions of the gate electrode layer formed in the opening 150 and on the top surface of the substrate 100 may be etched to obtain the gate lines 160.

The gate lines 160 may include the GSL (e.g., the gate line 160a), the word line (e.g., the gate lines 160b through 160e) and the SSL (e.g., the gate line 160f) sequentially stacked and spaced apart from one another in the first direction. The number of the levels at which the GSL, the word line and the SSL are formed may increase in consideration of a circuit design and a capacity of the vertical memory device.

The gate line 160 at each level may have a shape substantially the same as or similar to that of the sacrificial pattern 118. The gate line 160 at each level may include a step portion protruding in the second direction from an upper gate line 160 thereof.

Figure 27:
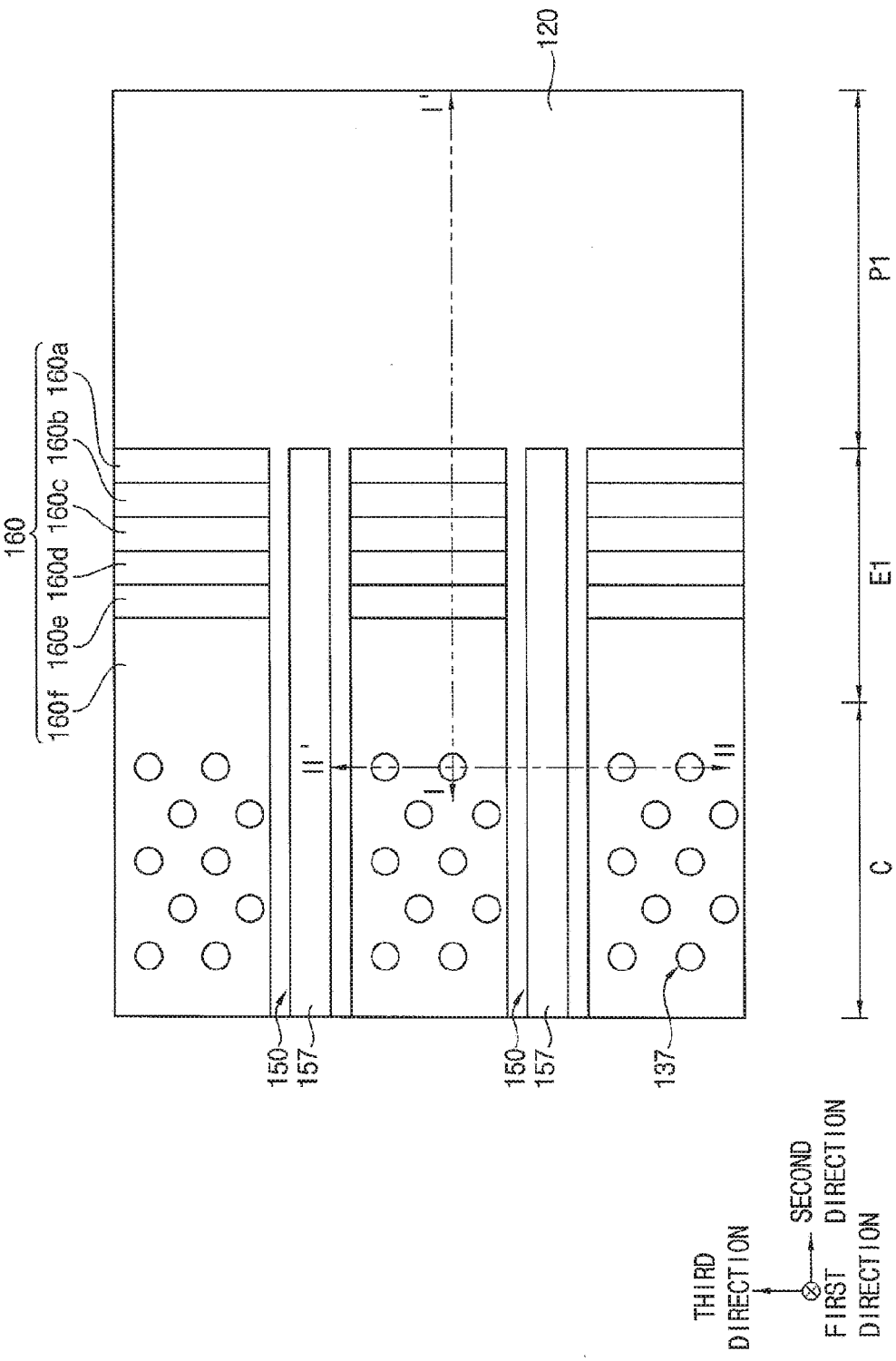

Referring to FIGS. 27 and 28, an ion-implantation process may be performed to form a second impurity region 105 at an upper portion of the substrate 100 exposed through the opening 150. The second impurity region 105 may extend in, e.g., the second direction.

Subsequently, an insulation pattern 155 and a cutting pattern 157 filling the opening 150 may be formed on the second impurity region 105.

For example, an insulation layer including silicon oxide may be formed along the top surface of the first upper insulation layer 140, and a sidewall and a bottom of the opening 150. Upper and lower portions of the insulation layer may be removed by an etch-back process to form the insulation pattern 150 on the sidewall of the opening 150. A conductive layer filling a remaining portion of the opening 150 may be formed on the first upper insulation layer 140. An upper portion of the conductive layer may be planarized by a CMP process to form the cutting pattern 157. The conductive layer may be formed of a metal, a metal silicide and/or doped polysilicon by a sputtering process or an ALD process.

In example embodiments, the cutting pattern 157 and the insulation pattern 155 may extend in the second direction together in the opening 150. In example embodiments, the cutting pattern 157 may serve as a CSL of the vertical memory device, and may be insulated from the gate lines 160 by the insulation pattern 155.

A gate line stack structure including the gate lines 160, the insulating interlayer patterns 116, and the channel rows extending through the gate lines 160 and the insulating interlayer patterns 116 may be defined by the cutting patterns 157 neighboring in the third direction.

Figure 29:
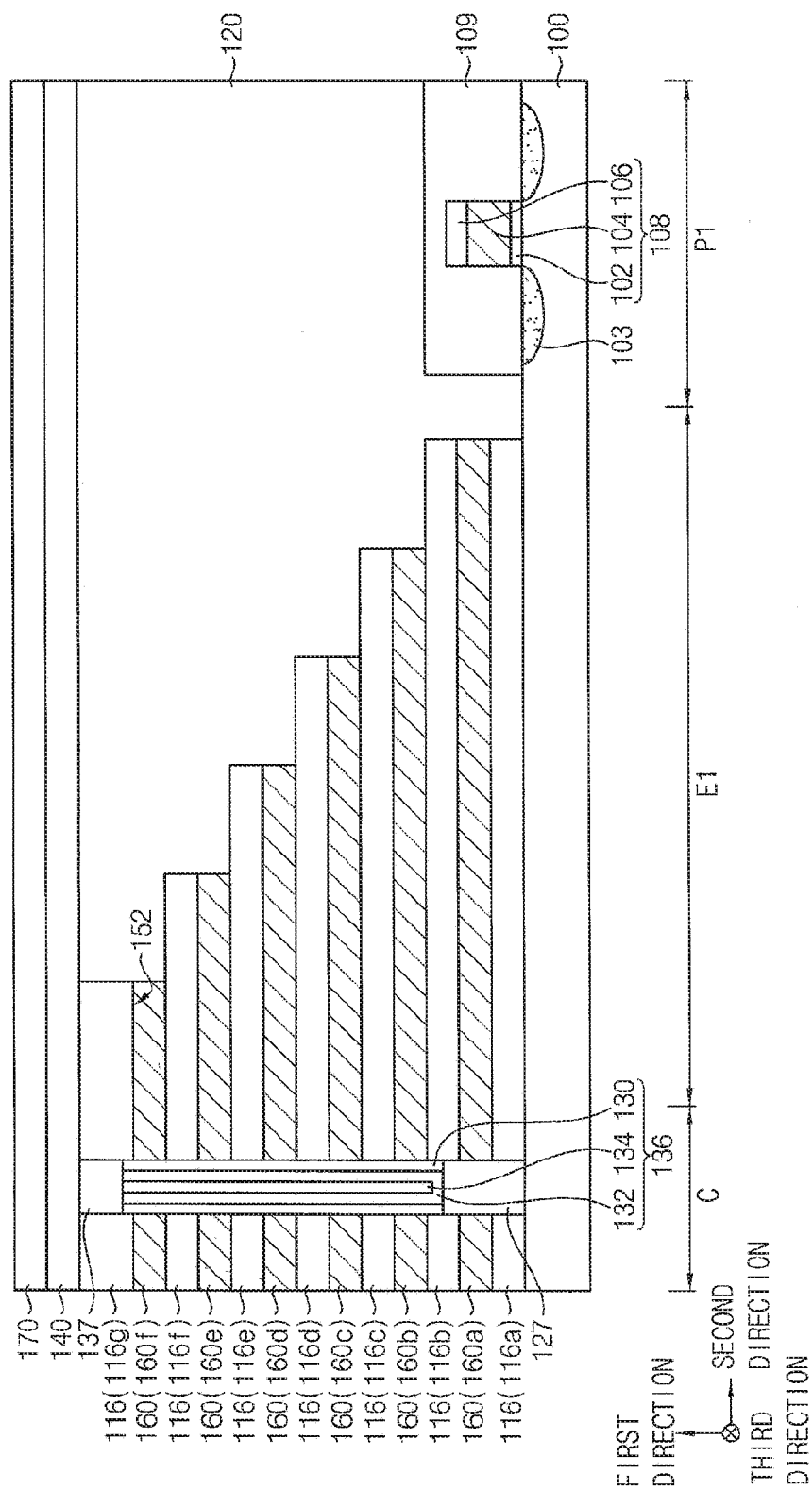
Figure 30:
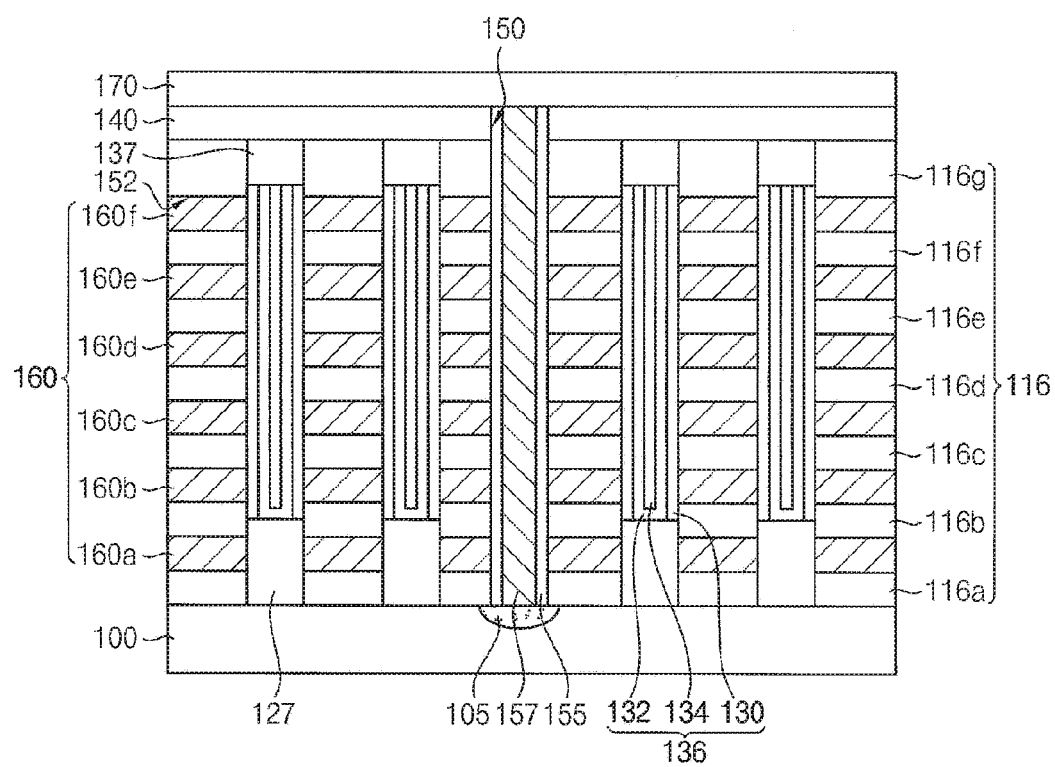

Referring to FIGS. 29 and 30, a second upper insulation layer 170 covering the cutting pattern 157 may be formed on the first upper insulation layer 140.

For example, the second upper insulation layer 170 may be formed of a silicon oxide-based material substantially the same as or similar to that of the first upper insulation layer 140 by a CVD process, a spin coating process, etc.

Figure 31:
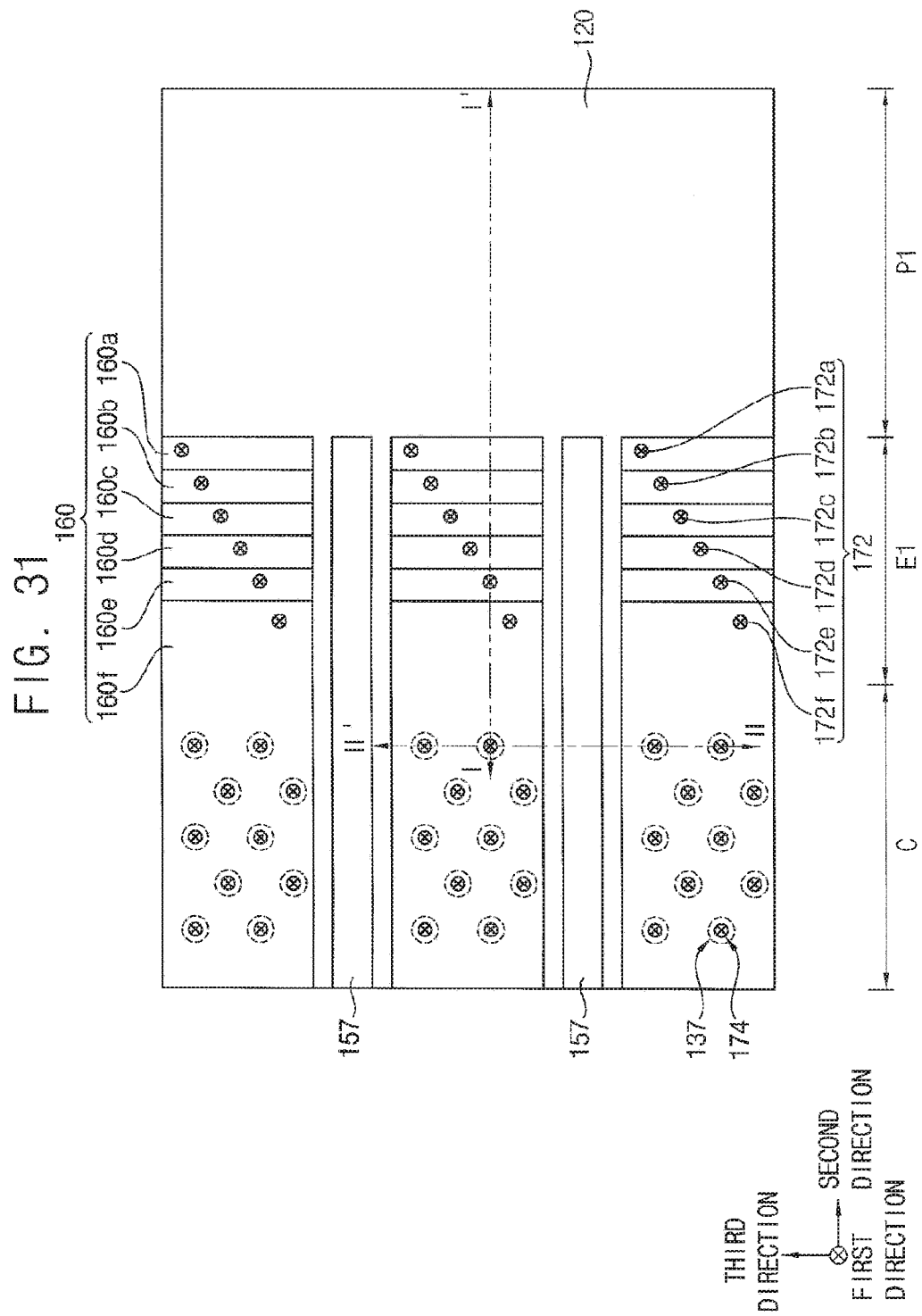
Figure 32:
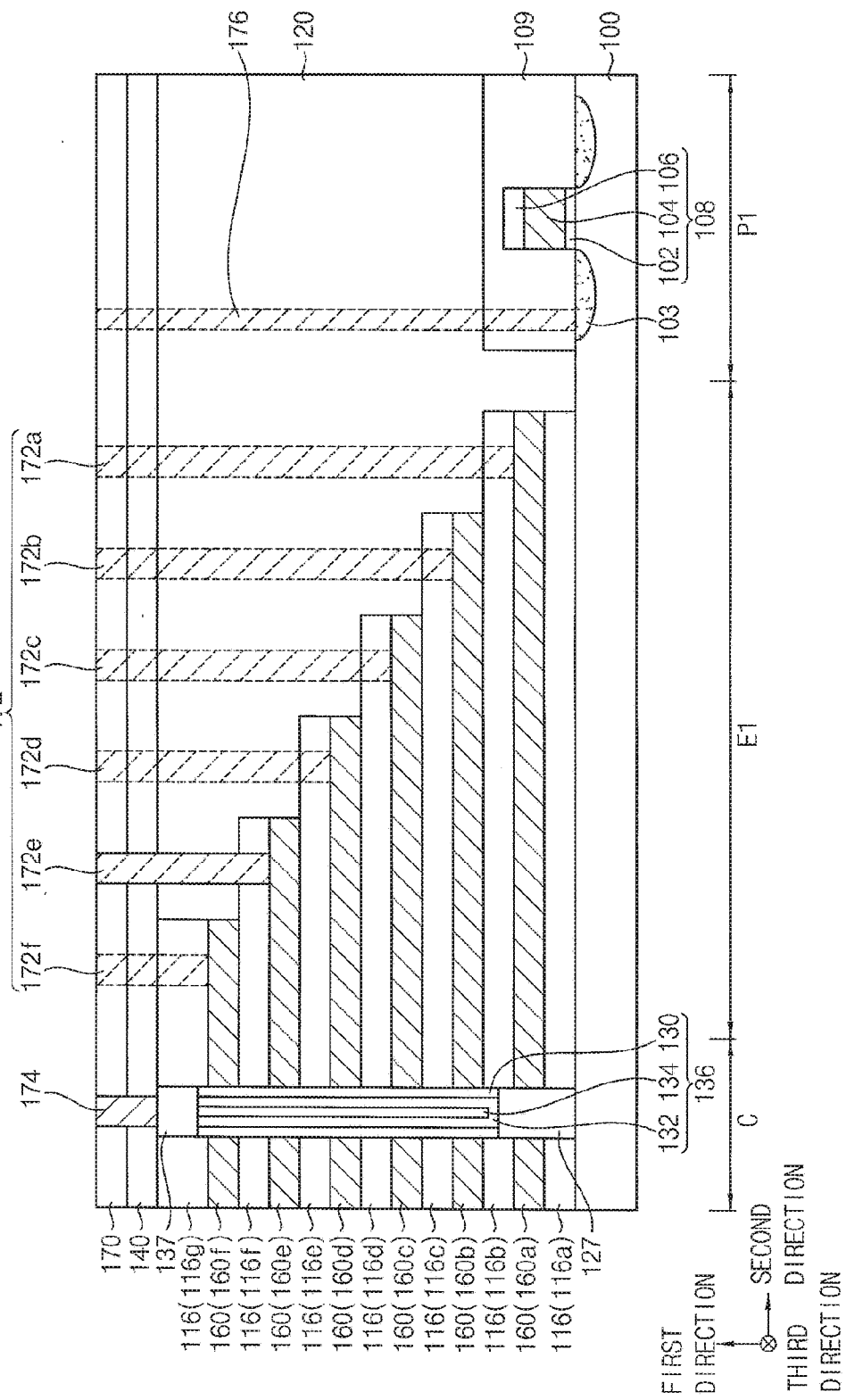

Referring to FIGS. 31 and 32, contacts may be formed through the second and first upper insulation layers 170 and 140.

In example embodiments, first contacts 172 (e.g., 172a through 172f) may be formed on the first extension region E1 to be landed on the step portions of the corresponding gate lines 160 (e.g., 160a through 160f).

In example embodiments, the first contacts 172a to 172e which may be connected to the GSL and the word lines may be formed through the second upper insulation layer 170, the first upper insulation layer 140, the mold protection layer 120 and the insulating interlayer patterns 116b to 116f.

In example embodiments, the first contact 172f which may be connected to the SSL may be formed through the second upper insulation layer 170, the first upper insulation layer 140 and the uppermost insulating interlayer pattern 116g.

In example embodiments, a bit line contact 174 may be formed on the cell region C. The bit line contact 174 may be formed through the second upper insulation layer 170 and the first upper insulation layer 140 to be electrically connected to the pad 137. In example embodiments, a peripheral circuit contact 176 may be further formed on the first peripheral region P1. The peripheral circuit contact 176 may be formed through the second upper insulation layer 170, the first upper insulation layer 140, the mold protection layer 120 and the peripheral circuit protection layer 109, and may be electrically connected to the first impurity region 103.

In example embodiments, contact holes for forming the bit line contact 174, the first contacts 172 and the peripheral circuit contact 176 may be concurrently formed by the substantially the same photo-lithography process. A first conductive layer filling the contact holes may be formed, and an upper portion of the first conductive layer may be planarized by a CMP process until a top surface of the second upper insulation layer 170 may be exposed. Accordingly, the bit line contact 174, the first contacts 172 and the peripheral circuit contact 176 may be substantially simultaneously formed from the first conductive layer.

In example embodiments, the photo-lithography process for forming the bit line contact 174, the first contacts 172 and the peripheral circuit contact 176 may be divided into a plurality of photo-lithography processes.

Figure 33:
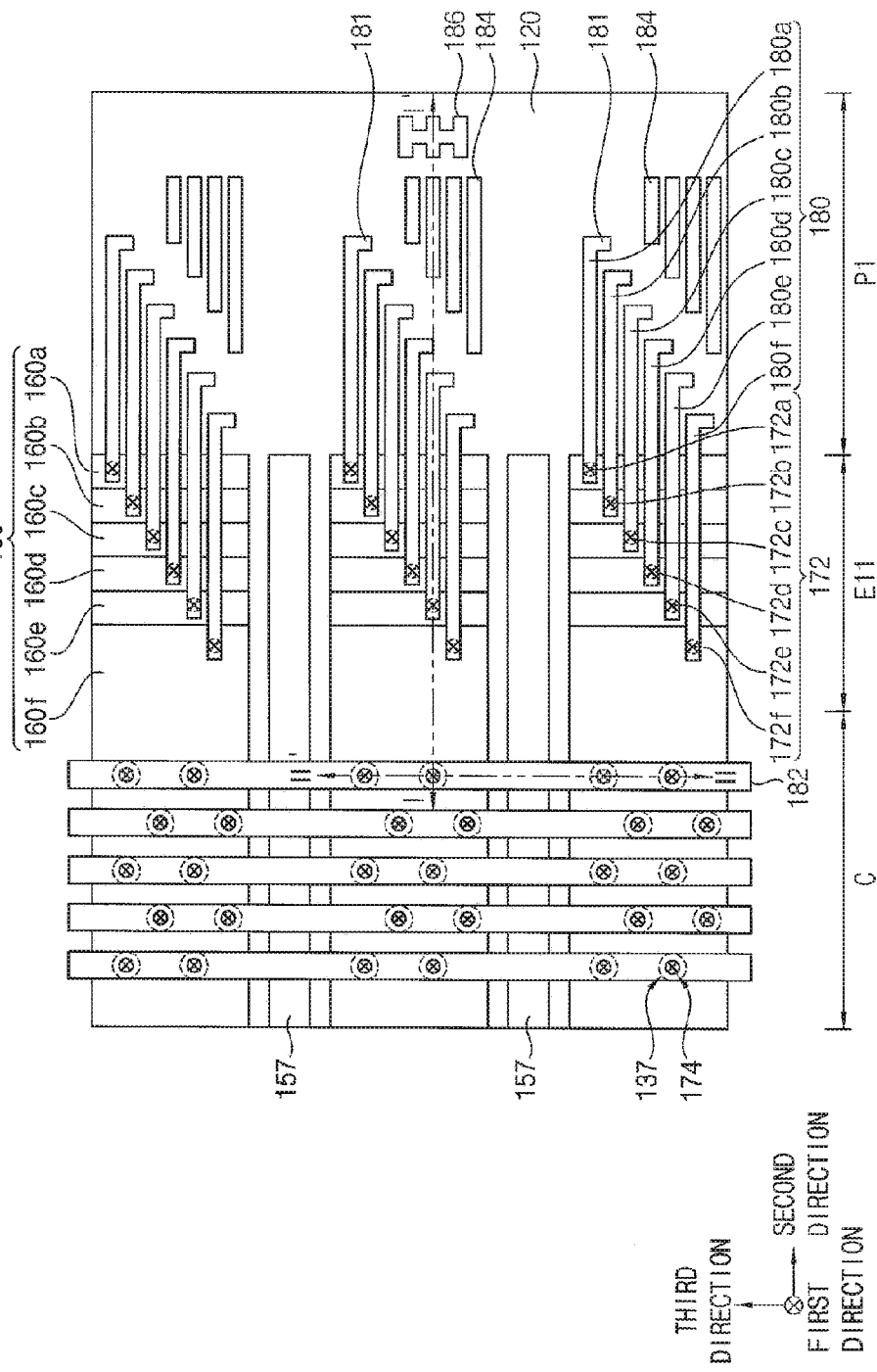
Figure 34:
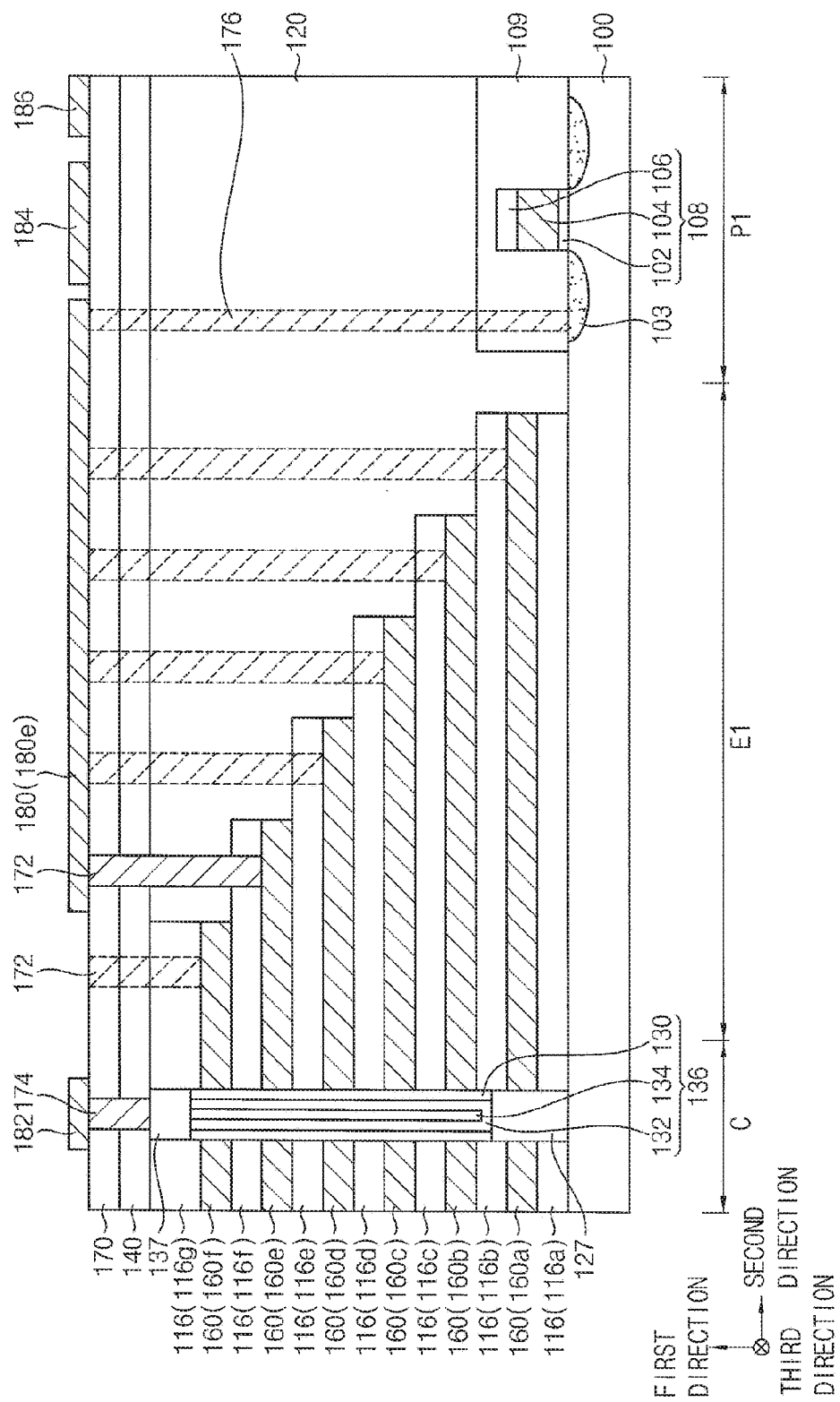

Referring to FIGS. 33 to 35, wirings electrically connected to the contacts may be formed on the second upper insulation layer 170. Additionally, an identification pattern 186 may be formed together with the wirings.

First wirings 180 (e.g., 180a through 180f) may be patterned to be electrically connected to the respective contacts 172 (e.g., 172a through 172f) which may be connected to the gate line stack structure. The first wirings 180 may extend in the second direction from the first extension region E1 to a portion of the first peripheral region P1. In example embodiments, dummy wirings 184 may be formed on the first peripheral region P1 together with the first wirings 180. The dummy wirings 184 may include a plurality of line patterns, and may be formed per each gate line stack structure or each cell block.

The bit line 182 may extend in the third direction on the cell region C, and may be patterned to be electrically connected to a plurality of the bit line contacts 174.

In example embodiments, the identification pattern 186 may be formed at one or more of the gate line stack structures and the cell blocks. The identification pattern 186 may be formed to be adjacent to the dummy wirings 184 on the first peripheral region P1. The identification pattern 186 may be formed in various shapes to be distinguished from the dummy wirings 184 and/or the first wirings 180 as described with reference to FIGS. 6 to 9.

In example embodiments, the first wiring 180, the dummy wiring 184 and the identification pattern 186 may be formed concurrently by substantially the same etching process with respect to a second conductive layer. In example embodiments, the bit line 182 may be also formed from the second conductive layer.

The first and second conductive layers may be formed of a metal, e.g., copper, aluminum, etc., by a sputtering process or an ALD process.

In example embodiments, for example, an operational failure test of the cell blocks may be conducted using the identification pattern 186 as an address identification guide. If the cell blocks are determined as normal through the operational failure test, an additional wirings build-up may be performed on the first wirings 180.

Figure 36:
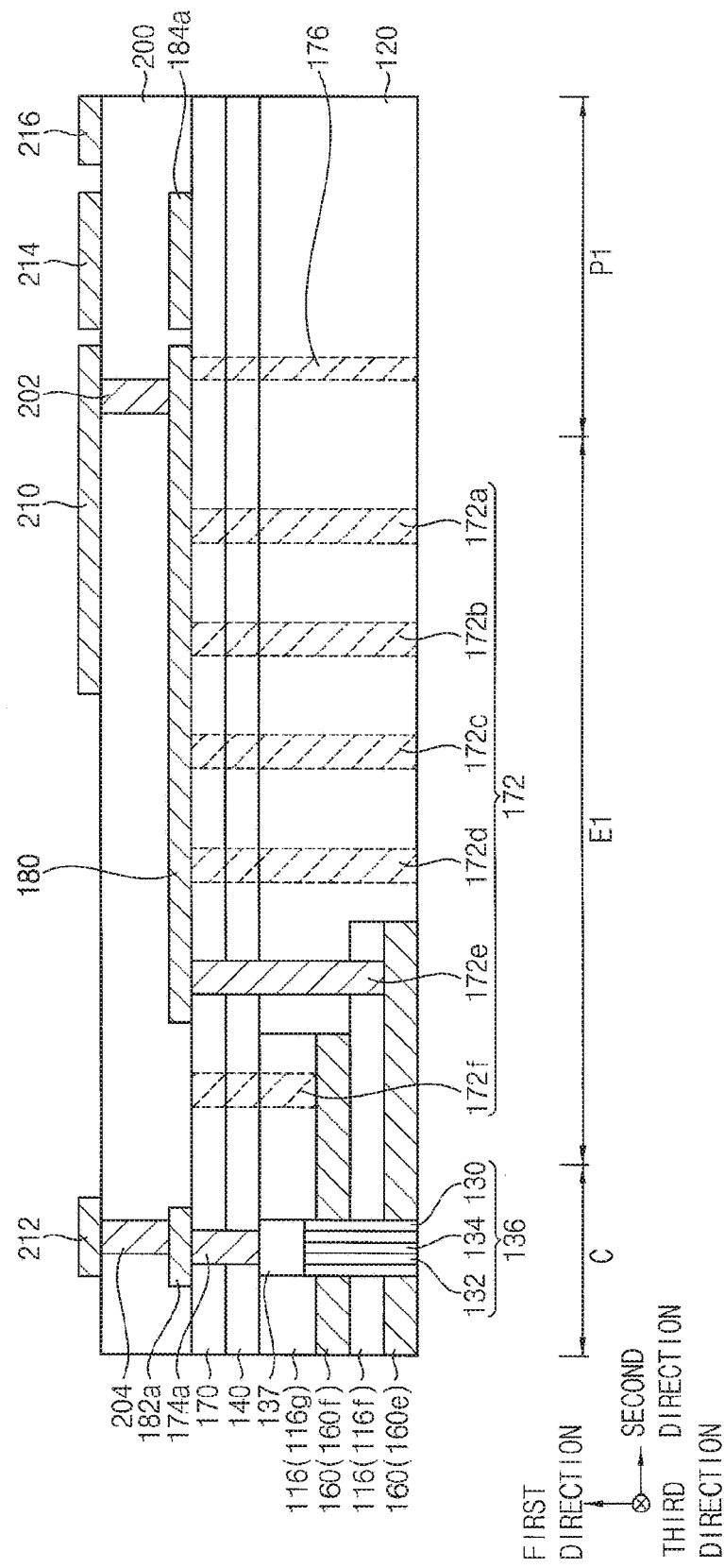
FIGS. 36 to 38 are cross-sectional views illustrating vertical memory devices in accordance with example embodiments.
Figure 37:
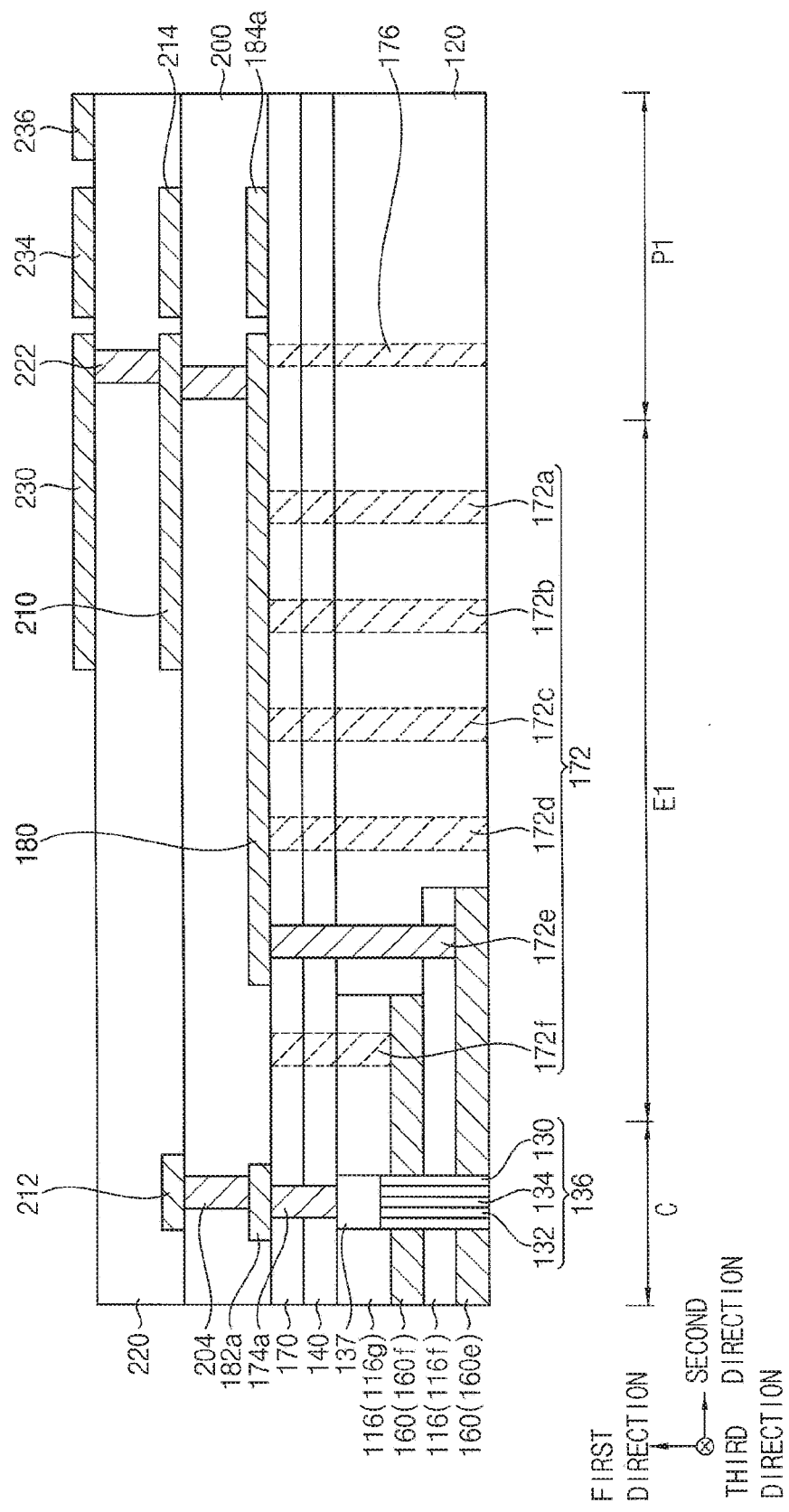
Figure 38:
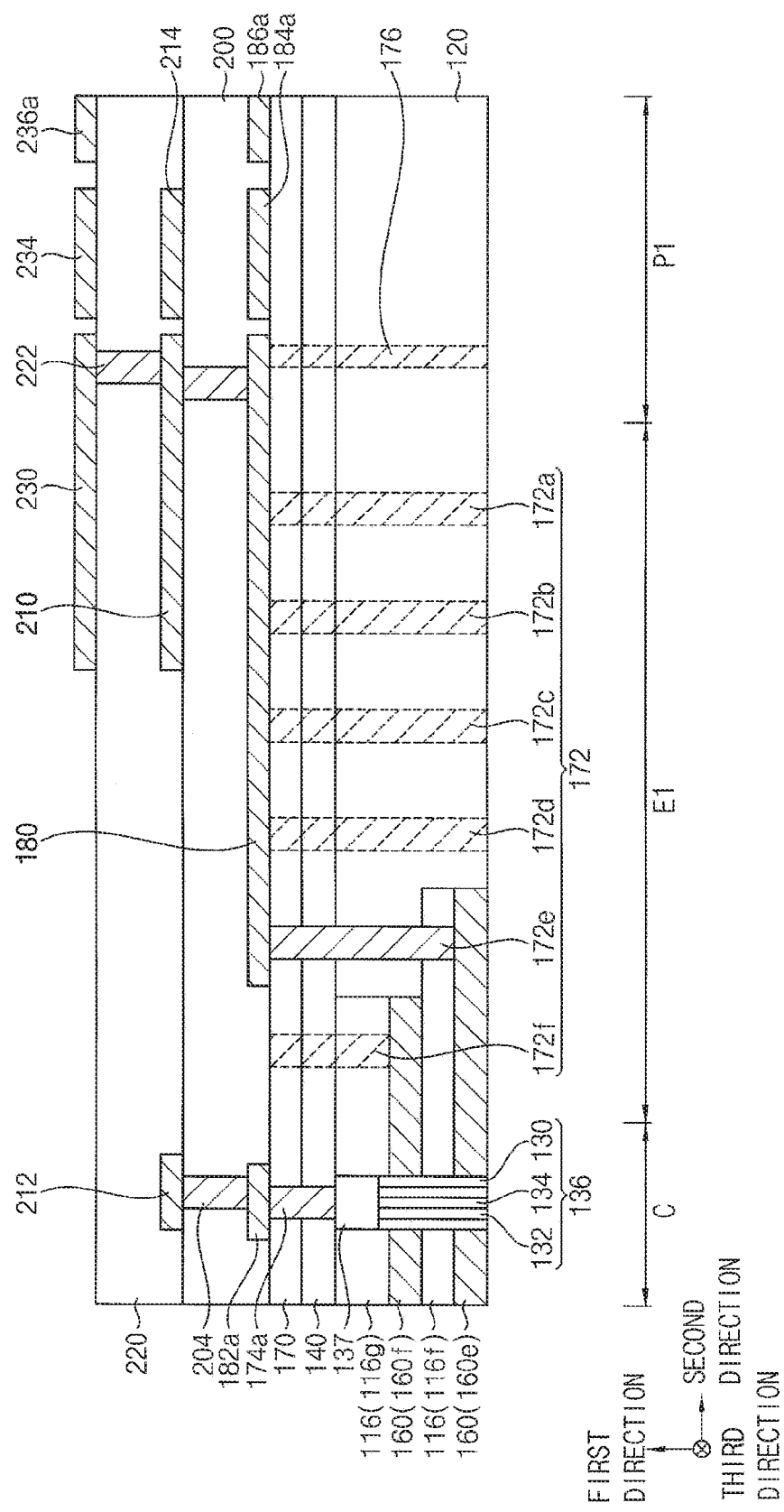

FIGS. 36 to 38 are cross-sectional views illustrating vertical memory devices in accordance with example embodiments. FIGS. 36 to 38 are partial cross-sectional views illustrating an upper portion of the vertical memory device which includes a wiring structure.

Detailed descriptions on elements and constructions substantially the same as or similar to those illustrated with reference to FIGS. 1 to 5 are omitted herein.

Referring to FIG. 36, the wiring structure may include a first contact 172, a first bit line contact 174a, a peripheral circuit contact 176, a first bit line 182a, a first wiring 180 and a first dummy wiring 184a. The first bit line 182a, the first wiring 180 and the first dummy wiring 184a may be formed at the substantially same level (e.g., on the second upper insulation layer 170).

In example embodiments, additional wirings may be disposed over the first bit line 182a, the first wiring 180 and the first dummy wiring 184a. For example, a third upper insulation layer 200 covering the first bit line 182a, the first wiring 180 and the first dummy wiring 184a may be formed on the second upper insulation layer 170.

A second bit line contact 204 and a second contact 202 may be formed through the third insulation layer 200 to be electrically connected to the first bit line 182a and the first wiring 180, respectively.

A second wiring 210, a second bit line 212 and a second dummy wiring 214 may be formed on the third upper insulation layer 200. The second wiring 210 may be electrically connected to the first wiring 180 via the second contact 202. The second bit line 212 may be electrically connected to the first bit line 182a via the second bit line contact 204. The second wiring 210 may extend throughout the first extension region E1 and the first peripheral region P1. The second bit line 213 may extend on the cell region C in, e.g., the third direction.

The second dummy wiring 214 may be provided per each cell block, and may be spaced apart from the second wiring 210 to be disposed on the first peripheral region P1.

In example embodiments, an identification pattern 216 may be disposed on a portion of the third upper insulation layer 200 of the first peripheral region P1 to be adjacent to the second dummy wiring 214.

In example embodiments, the second wiring 210, the second bit line 212, the second dummy wiring 214 and the identification pattern 216 may be formed from substantially the same patterning process with respect to, e.g., a third conductive layer.

Referring to FIG. 37, additional wirings may be further disposed over the second bit line 212, the second wiring 210 and the second dummy wiring 214.

For example, a fourth upper insulation layer 220 covering the second bit line 212, the second wiring 210 and the second dummy wiring 214 may be formed on the third upper insulation layer 200.

A third contact 222 may be formed through the fourth upper insulation layer 220 to be electrically connected to the second wiring 210.

In example embodiments, a third wiring 230 and a third dummy wiring 234 may be formed on the fourth upper insulation layer 220. The third wiring 230 may be electrically connected to the second wiring 210 via the third contact 222. The third wiring 230 may extend throughout the first extension region E1 and the first peripheral region P1. The third dummy wiring 234 may be provided per each cell block, and may be spaced apart from the third wiring 230 to be disposed on the first peripheral region P1.

In example embodiments, an identification pattern 236 may be disposed on a portion of the fourth upper insulation layer 220 of the first peripheral region P1 to be adjacent to the third dummy wiring 234.

In example embodiments, the third wiring 230, the third dummy wiring 234 and the identification pattern 236 may be formed from substantially the same patterning process with respect to, e.g., a fourth conductive layer.

As illustrated in FIGS. 3, 36 and 37, the identification pattern may be disposed at a wiring level corresponding to the first wiring 180, the second wiring 210 or the third wiring 230 to be provided as an address identification guide.

In example embodiments, the identification pattern may be disposed at two or more of the wiring levels corresponding to the first wiring 180, the second wiring 210 or the third wiring 230.

Referring to FIG. 38, for example, a first identification pattern 186a may be disposed at the same wiring level as that of the first wiring 180, and a second identification pattern 236a may be disposed at the same wiring level as that of the third wiring 230.

In example embodiments, the first identification pattern 186a may serve as an address identification guide for a failure test. The second identification pattern 236a may serve as an address identification guide for applying a driving signal.

Figure 39:
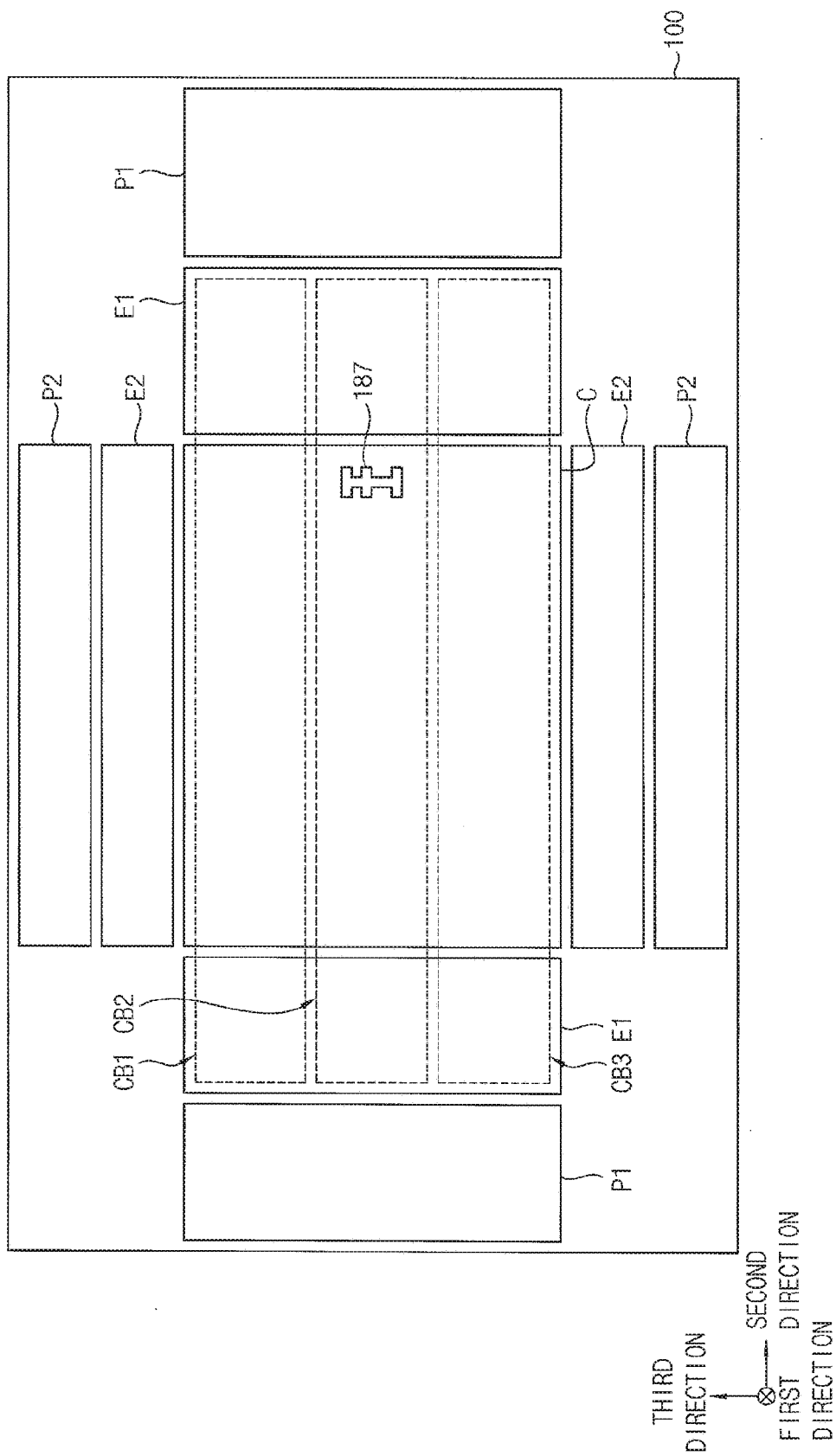
FIG. 39 is a schematic top plan view illustrating regions of a vertical memory device in accordance with example embodiments.
Figure 40:
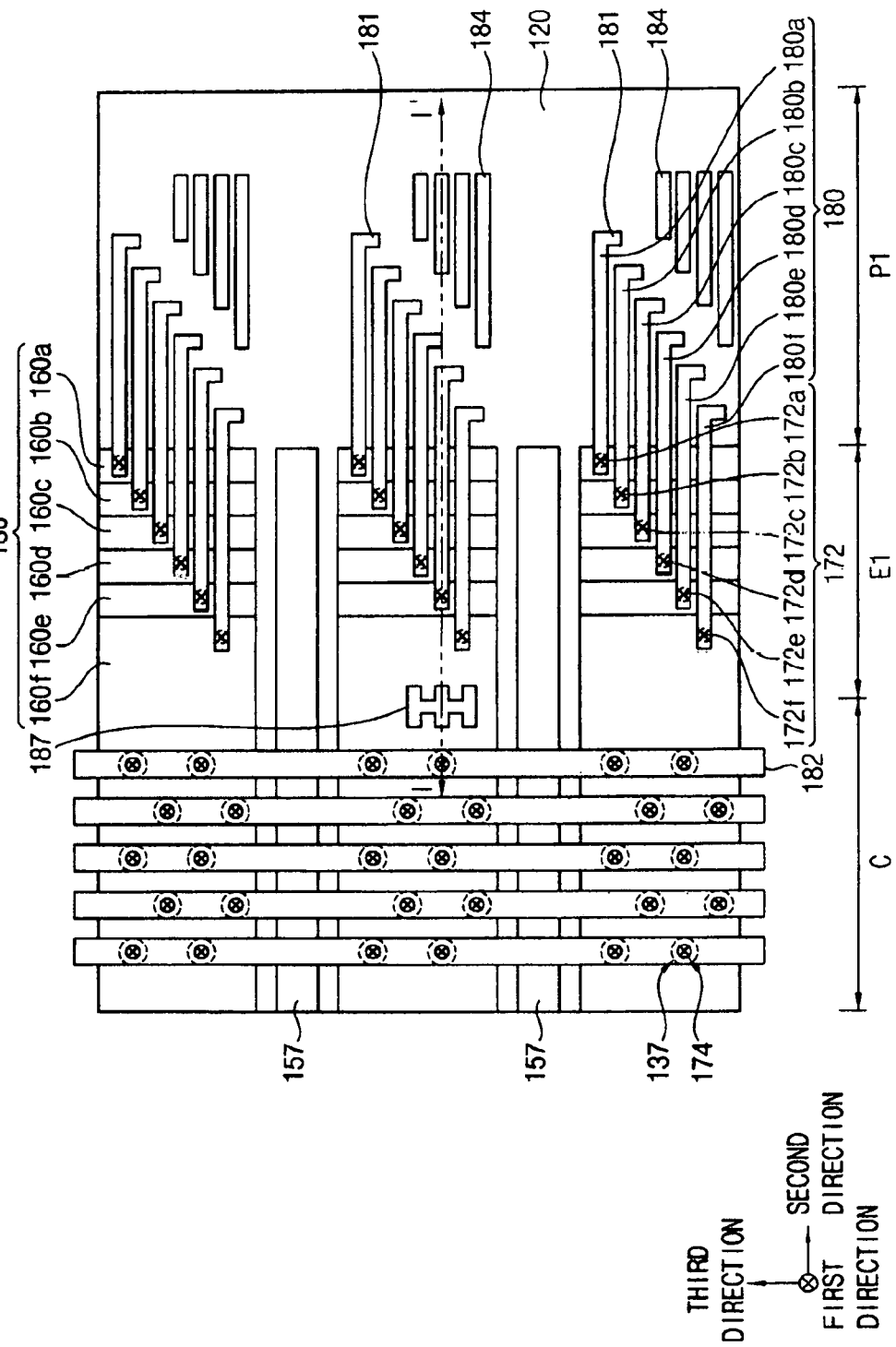
FIGS. 40 to 42 are a top plan view and cross-sectional views illustrating vertical memory devices in accordance with example embodiments.
Figure 41:
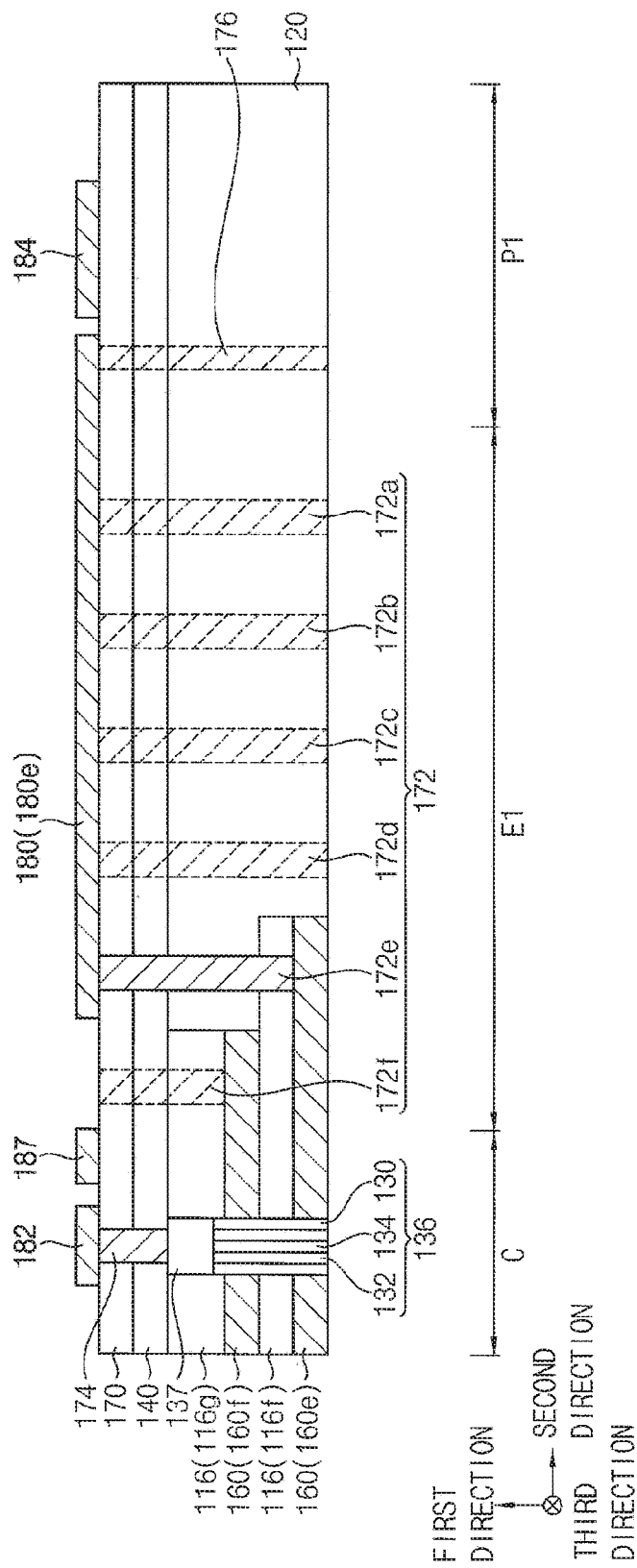
Figure 42:
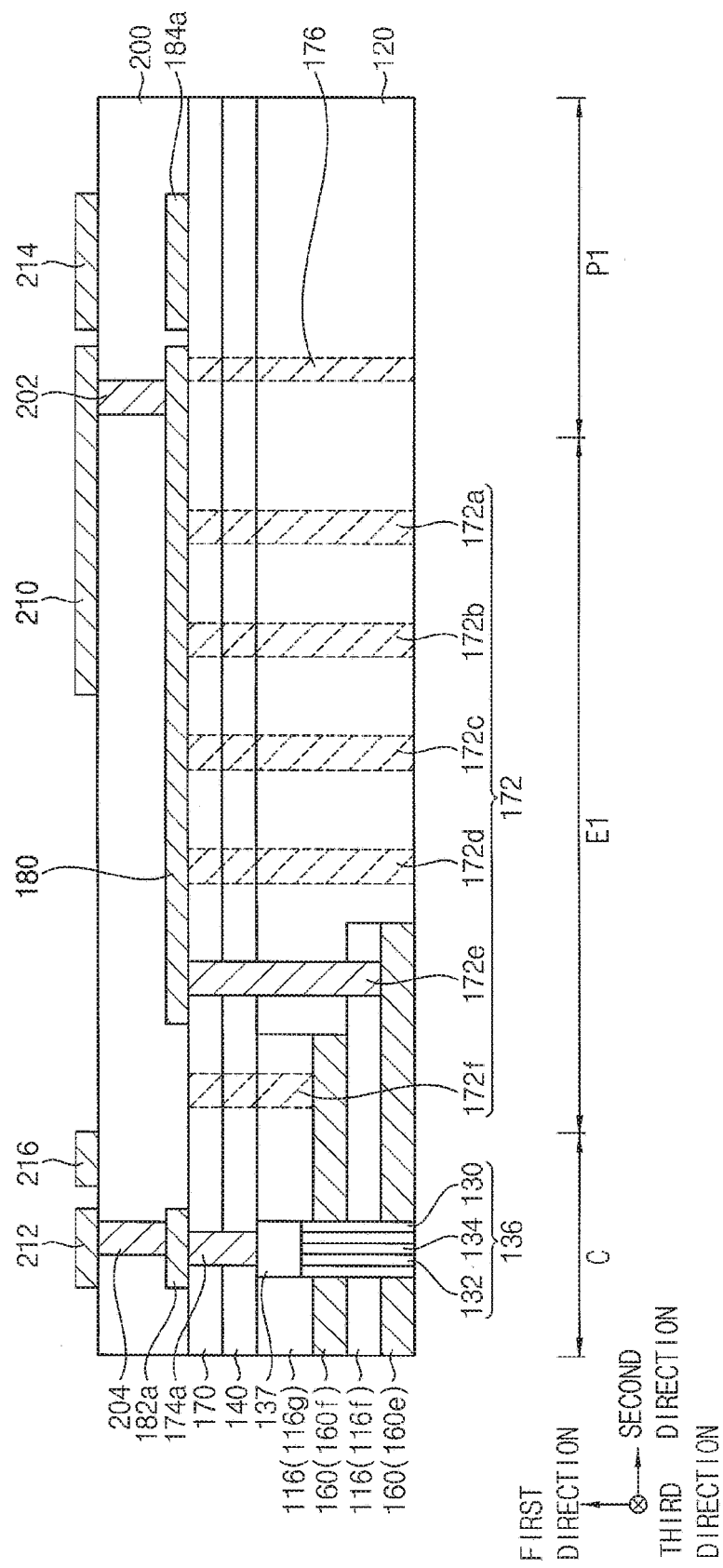

FIG. 39 is a schematic top plan view illustrating regions of a vertical memory device in accordance with example embodiments. FIGS. 40 to 42 are a top plan view and cross-sectional views illustrating vertical memory devices in accordance with example embodiments. Specifically, FIG. 40 is a top plan view of the vertical memory device. FIGS. 41 and 42 are cross-sectional views taken along a line I-I' indicated in FIG. 40.

Detailed descriptions on elements and/or constructions substantially the same as or similar to those described with reference to FIGS. 1 to 4, and/or FIGS. 36 to 38 are omitted herein.

Referring to FIGS. 39 and 40, as also illustrated with reference to FIGS. 1 and 2, the vertical memory device or the substrate 100 may include the cell region C, the first and second extension regions E1 and E2, and the first and second peripheral regions P1 and P2.

A plurality of the cell blocks CB1, CB2 and CB3 may be defined by the cutting pattern 157 extending throughout the cell region C and the first extension region E1. Step portions of the gate lines 160 included in each cell block may be arranged on the first extension region E1.

In example embodiments, an identification pattern 187 may be disposed on an end portion of the cell region C adjacent to the first extension region E1. For example, the identification pattern 187 may be disposed on a remaining space of the cell region C between a region in which the vertical channel structures 136 may be formed and a region in which an uppermost first contact 172f may be formed.

In example embodiments, the identification pattern may be disposed at a boundary between the cell region C and the first extension region E1.

As described above, the identification pattern 187 may be moved from the first peripheral region P1 to the end portion or the boundary of the cell region C so that an area of the first peripheral region P1 may be saved or reduced.

Referring to FIG. 41, the identification pattern 187 may be disposed at substantially the same level as that of the first wiring 180. For example, the identification pattern 187 may be disposed on the second upper insulation layer 170 to be adjacent to the bit line 182.

Referring to FIG. 42, as also described with reference to FIG. 36, additional wirings may be further formed over the first bit line 174a, the first wiring 180 and the first dummy wiring 184a. For example, the second bit line 212, the second wiring 210 and the second dummy wiring 214 may be disposed on the third upper insulation layer 200.

In example embodiments, an identification pattern 216 may be disposed at substantially the same level as that of the second wiring 210. For example, the identification pattern 216 may be disposed on the third upper insulation layer 200 to be adjacent to the second bit line 212.

Figure 43:
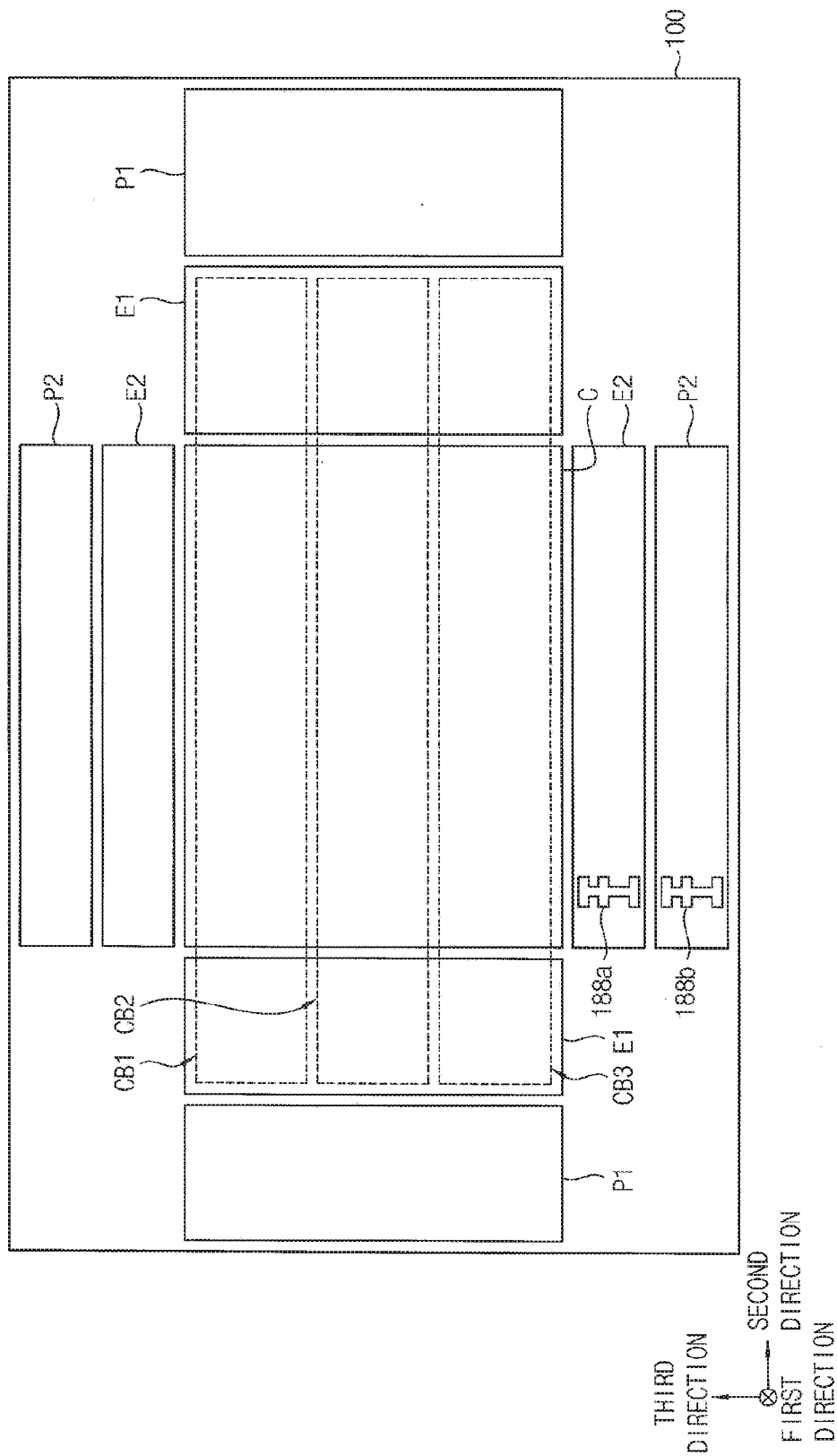
FIG. 43 is a schematic top plan view illustrating regions of a vertical memory device in accordance with example embodiments.

FIG. 43 is a schematic top plan view illustrating regions of a vertical memory device in accordance with example embodiments.

Referring to FIG. 43, as also illustrated with reference to FIGS. 1 and 2, the vertical memory device may include the cell region C, the first and second extension regions E1 and E2, and the first and second peripheral regions P1 and P2. The cell blocks CB1, CB2 and CB3 may be defined by a cutting pattern on the cell region C and the first extension region E1.

In example embodiments, the second extension region E2 may be allotted as a dummy region, and the second peripheral region P2 may serve as a page buffer region.

In example embodiments, an identification pattern may be disposed on the second extension region E2 and/or the second peripheral region P2.

In example embodiments, the identification pattern may include a first identification pattern 188a disposed on the second extension region E2, and a second identification pattern 188b disposed on the second peripheral region P2.

The identification pattern may be provided on the peripheral region and/or the extension region in the third direction. Thus, an address identification guide may be also provided when, e.g., applying a signal through a bit line.

Figure 44:
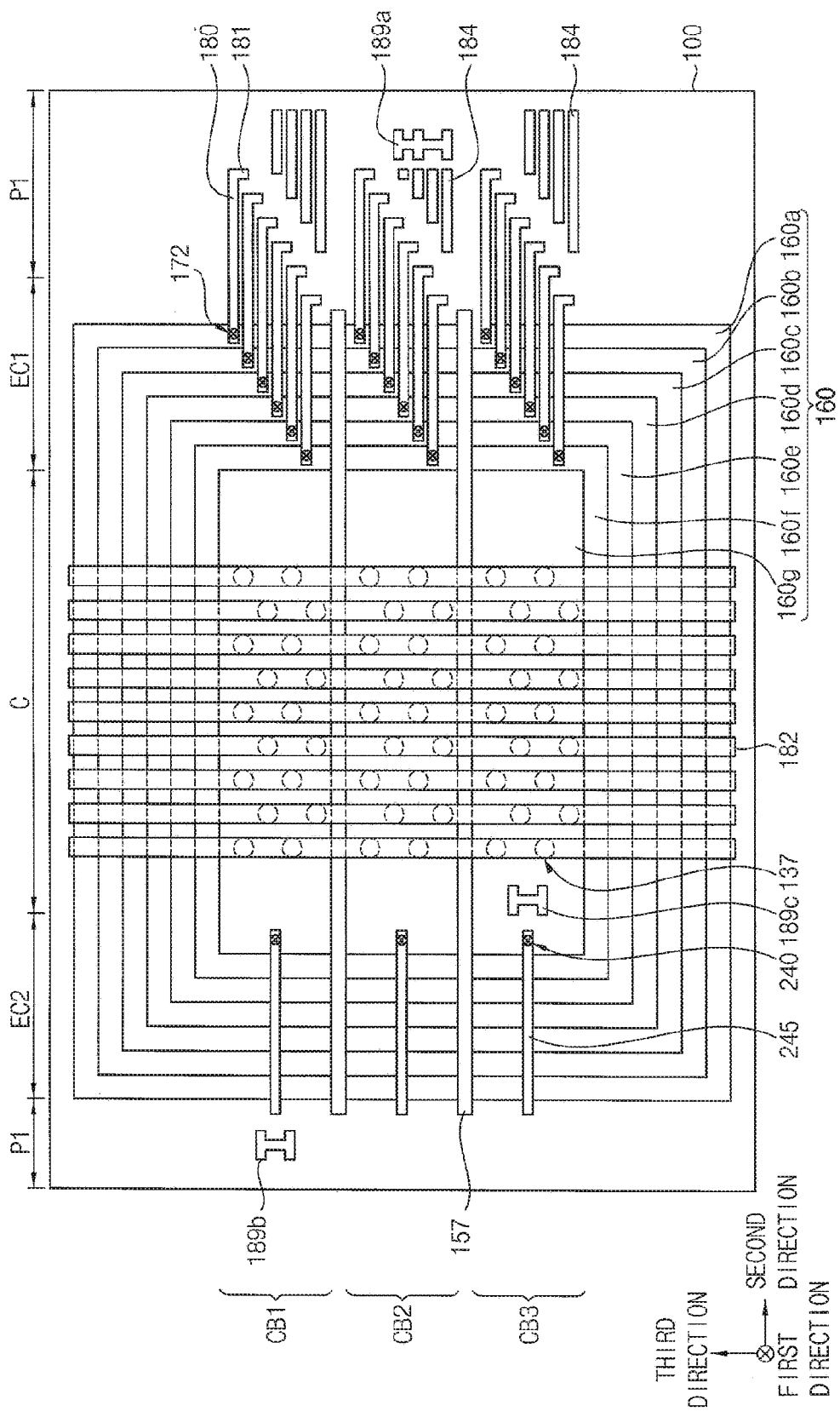
FIG. 44 is a top plan view illustrating a vertical memory device in accordance with example embodiments.

FIG. 44 is a top plan view illustrating a vertical memory device in accordance with example embodiments. Detailed descriptions on elements and/or constructions substantially the same as or similar to those illustrated with reference to FIGS. 1 and 2 are omitted herein.

Referring to FIG. 44, as also described with reference to FIG. 1, the first extension region and the first peripheral region P1 may be arranged sequentially from the cell region C. The first extension regions and the first peripheral regions P1 may be substantially symmetrical with respect to the cell region C.

In example embodiments, the first extension region may include a first contact region EC1 and a second contact region EC2. The first contact region EC1 and the second contact region EC2 may be adjacent to both lateral portions of the cell region C in the second direction.

The gate lines 160 (e.g., 160a through 160g) may be stacked along the first direction on the cell region C and the first extension region.

In example embodiments, a cell block or a gate line stack structure of the vertical memory device may include SSLs of at least two levels. For example, a lowermost gate line 160a may serve as a GSL, and two uppermost gate lines 160f and 160g may serve as the SSL. Gate lines 160b to 160e between the GSL and the SSL may serve as word lines.

The first contacts 172 and the first wirings 180 electrically connected to the GSL and the word lines may be disposed on the first contact region EC1. In example embodiments, the first contact 172 and the first wiring 180 electrically connected to a lower SSL 160f may be also disposed on the first contact region EC1.

The dummy wirings 184 may be disposed on the first peripheral region P1 adjacent to the first contact region EC1.

A second contact 240 and a second wiring 245 electrically connected to the SSL may be disposed on the second contact region EC2. In example embodiments, the second contact 240 and the second wiring 245 may be electrically connected to an upper SSL 160g.

The first wiring 180 and the second wiring 245 may extend in the second direction, and may be disposed at substantially the same wiring level. In example embodiments, the second wiring 245 may be disposed at an upper wiring level of the first wiring 180.

A plurality of cell blocks including, e.g., first to third cell blocks CB1, CB2 and CB3 may be defined by the cutting pattern intersecting the cell region C and the first extension region.

In example embodiments, an identification pattern may be disposed at the wiring level. The identification pattern may include a plurality of patterns having different shapes or being formed at different regions.

For example, a first identification pattern 189a may be disposed on the first peripheral region P1 adjacent to the first contact region EC1, and may serve as an identification pattern for the second cell block CB2.

A second identification pattern 189b may have a different shape from that of the first identification pattern 189a. For example, the second identification pattern 189b may be disposed on the first peripheral region P1 adjacent to the second contact region EC2. The second identification pattern 189b may serve as an identification pattern for the first cell block CB1, and may serve as an address identification guide for selecting the cell block through the SSL.

A third identification pattern 189c may have a different shape from that of the first identification pattern 189a. For example, the third identification pattern 189c may be disposed on an end portion of the cell region C adjacent to the second contact region EC2. The third identification pattern 189c may serve as an identification pattern for the third cell block CB3, and may serve as an address identification guide for selecting the cell block through the SSL.

The first to third identification patterns 189a, 189b and 189c may be disposed at the same wiring level or different wiring levels.

As described above, the identification patterns may be arranged in different shapes and/or in different regions. Thus, address identification guides for selecting the cell block, applying a signal through, e.g., the first wiring 180, detecting failures of the cell block, etc., may be concurrently provided.

According to example embodiments of the present inventive concepts, an identification pattern for searching an address of a cell block may be formed. The identification pattern may be formed by the same patterning process as that for forming wirings over the gate line stack structure. The identification pattern and the wirings may be located at the same level. The identification pattern may be formed over the gate line stack structure, and thus may be easily identified without an additional optical device. Thus, the identification pattern may serve as a reference when detecting a failed cell block and identifying a cell block for applying a signal.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A vertical memory device, comprising:
   a substrate;
   a plurality of channels on the substrate, the channels extending in a first direction that is vertical to a top surface of the substrate;
   a plurality of gate lines stacked on top of each other on the substrate, the gate lines surrounding the channels, the gate lines being spaced apart from each other along the first direction;
   a plurality of wirings over the gate lines and electrically connected to the gate lines; and
   an identification pattern on the substrate at the same level as a level of at least one of the wirings.

2. The vertical memory device of claim 1, wherein
   the gate lines at each level include a step portion extending in a second direction parallel to the top surface of the substrate, and
   the wirings are electrically connected to the step portions of corresponding gate lines.

3. The vertical memory device of claim 1, wherein
   the wirings are disposed at a plurality of levels over the substrate, and
   the identification pattern is at the same level as a level of a lowermost wiring of the wirings.

4. The vertical memory device of claim 1, wherein
the wirings are disposed at a plurality of levels over the substrate, and
the identification pattern is disposed at the same level as a level of an uppermost wiring of the wirings.

5. The vertical memory device of claim 1, wherein
the wirings are disposed at a plurality of levels over the substrate, and
the identification pattern is disposed at two or more levels of the plurality of the levels.

6. The vertical memory device of claim 1, wherein the identification pattern includes one of a plurality of dot patterns, a plurality of line patterns, and a combination of a dot pattern and a line pattern.

7. The vertical memory device of claim 1, wherein the identification pattern and the wirings include a conductive material that is the same.

8. The vertical memory device of claim 2, wherein the identification pattern is spaced apart from the channels in the second direction with respect to the wirings.

9. The vertical memory device of claim 2, further comprising:
a bit line extending in a third direction that is parallel to the top surface of the substrate and crosses the second direction, wherein
the bit line is connected to at least one of the channels, and
the identification pattern and the bit line are at the same level.

10. The vertical memory device of claim 8, further comprising:
a dummy wiring on the substrate between the identification pattern and one of the wirings.

11. The vertical memory device of claim 9, wherein the identification pattern is between the bit line and the wirings in a plan view.

12. The vertical memory device of claim 6, wherein
the identification pattern includes the plurality of the line patterns, and
the line patterns cross each other.

13. A vertical memory device, comprising:
a substrate including a cell region, an extension region and a peripheral region;
a plurality of vertical channels on the cell region;
gate lines on the substrate, the gate lines surrounding the vertical channels, the gate lines stacked on top of each other on a top surface of the substrate, the gate lines extending over the cell region and the extension region;
contacts electrically connected to the gate lines on the extension region;
wirings electrically connected to the gate lines via the contacts, the wirings extending from the extension region to the peripheral region; and
an identification pattern on the substrate over an uppermost gate line of the gate lines.

14. The vertical memory device of claim 13, wherein the identification pattern is at the same level above the substrate as a level of at least one of the wirings.

15. The vertical memory device of claim 13, wherein
the vertical channels extend in a first direction that is vertical to a top surface of the substrate, and
the gate lines extend in a second direction and a third direction that are parallel to the top surface of the substrate and cross each other.

16. A vertical memory device, comprising:
a substrate including a cell region, extension region, and a peripheral region;
a cell block including,
gate lines stacked on top of each other, and
channels extending vertically through the gate lines;
an insulation layer on the cell block, the insulation layer extending over the cell region, the extension region, and the peripheral region; and
a conductive pattern on the insulation layer,
the conductive pattern including wirings and an identification pattern that are spaced apart each other on the insulation layer,
the wirings being electrically connected to the gate lines, and
the identification pattern being at the same level above the substrate as a level of the wirings.

17. The vertical memory device of claim 16, wherein
the conductive pattern includes bit lines at the same level above the substrate as the wirings and the identification pattern,
the bit lines are electrically connected to the channels, and
the bit lines are spaced apart from the wirings and the identification pattern.

18. The vertical memory device of claim 16, further comprising:
bit lines on the cell block; and
a second insulation layer on top of the bit lines and the insulation layer, wherein
the insulation layer is a first insulation layer, and
the conductive pattern is on top of the second insulation layer.

19. The vertical memory device of claim 16, wherein the wirings and the identification pattern are formed of the same material.

20. The vertical memory device of claim 17, wherein
the conductive pattern includes a dummy pattern,
the dummy pattern is spaced apart from the wirings and the identification pattern at the same level, and
the identification pattern is over the peripheral region.

* * * * *